United States Patent
Ishihara

(10) Patent No.: US 12,041,772 B2
(45) Date of Patent: Jul. 16, 2024

(54) SEMICONDUCTOR STORAGE DEVICE

(71) Applicant: Kioxia Corporation, Tokyo (JP)

(72) Inventor: Hanae Ishihara, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 390 days.

(21) Appl. No.: 17/446,106

(22) Filed: Aug. 26, 2021

(65) Prior Publication Data

US 2022/0254800 A1 Aug. 11, 2022

(30) Foreign Application Priority Data

Feb. 5, 2021 (JP) .................. 2021-017321

(51) Int. Cl.
| | |
|---|---|
| H01L 29/76 | (2006.01) |
| H10B 41/10 | (2023.01) |
| H10B 41/27 | (2023.01) |
| H10B 43/10 | (2023.01) |
| H10B 43/27 | (2023.01) |

(52) U.S. Cl.
CPC ............. *H10B 43/10* (2023.02); *H10B 41/10* (2023.02); *H10B 41/27* (2023.02); *H10B 43/27* (2023.02)

(58) Field of Classification Search
CPC ....... H01L 29/788; H10B 43/10; H10B 43/27; H10B 41/10; H10B 41/27
USPC ........................................................ 257/314
See application file for complete search history.

(56) References Cited

U.S. PATENT DOCUMENTS

| | | | |
|---|---|---|---|
| 7,983,084 B2 * | 7/2011 | Tokiwa ................. | H10B 43/27 365/185.11 |
| 8,791,524 B2 * | 7/2014 | Ichinose ............. | H01L 29/7926 257/326 |
| 10,510,770 B2 * | 12/2019 | Harada .................. | H10B 43/10 |
| 2013/0234235 A1 * | 9/2013 | Matsuda ........... | H01L 29/66833 257/324 |
| 2017/0148810 A1 * | 5/2017 | Kai ....................... | H01L 23/535 |
| 2017/0278859 A1 * | 9/2017 | Sharangpani ....... | H01L 21/0217 |
| 2018/0047744 A1 * | 2/2018 | Utsumi .................. | H10B 43/30 |
| 2018/0269219 A1 * | 9/2018 | Ito .......................... | H10B 43/40 |
| 2019/0035733 A1 * | 1/2019 | Park .................. | H01L 21/76816 |
| 2019/0043881 A1 * | 2/2019 | Kim .................... | H01L 29/6681 |
| 2019/0267392 A1 * | 8/2019 | Nakatsuka ........ | H01L 29/40117 |
| 2019/0287995 A1 | 9/2019 | Oike et al. | |

(Continued)

FOREIGN PATENT DOCUMENTS

JP 2019-161059 A 9/2019

*Primary Examiner* — Nitin Parekh
(74) *Attorney, Agent, or Firm* — Foley & Lardner LLP

(57) ABSTRACT

A device includes a first region including first semiconductor pillars extending through first conductive layers; a second region including second semiconductor pillars extending through second conductive layers; and a third region disposed between the first region and the second region and including insulator columns extending through third conductive layers. The third region includes a fourth region and a fifth region. In the fourth region, one third conductive layer electrically connects one first conductive layer and one second conductive layer to each other, and in the fifth region, one third conductive layer is connected to a contact plug. A first diameter of a first subset of the insulator columns provided in the fourth region is smaller than a second diameter of a second subset of the insulator columns provided in the fifth region.

14 Claims, 24 Drawing Sheets

(56) References Cited

U.S. PATENT DOCUMENTS

2019/0296117 A1* 9/2019 Ishiduki .............. H01L 29/7926
2020/0075622 A1* 3/2020 Fujii ..................... H10B 41/27

* cited by examiner

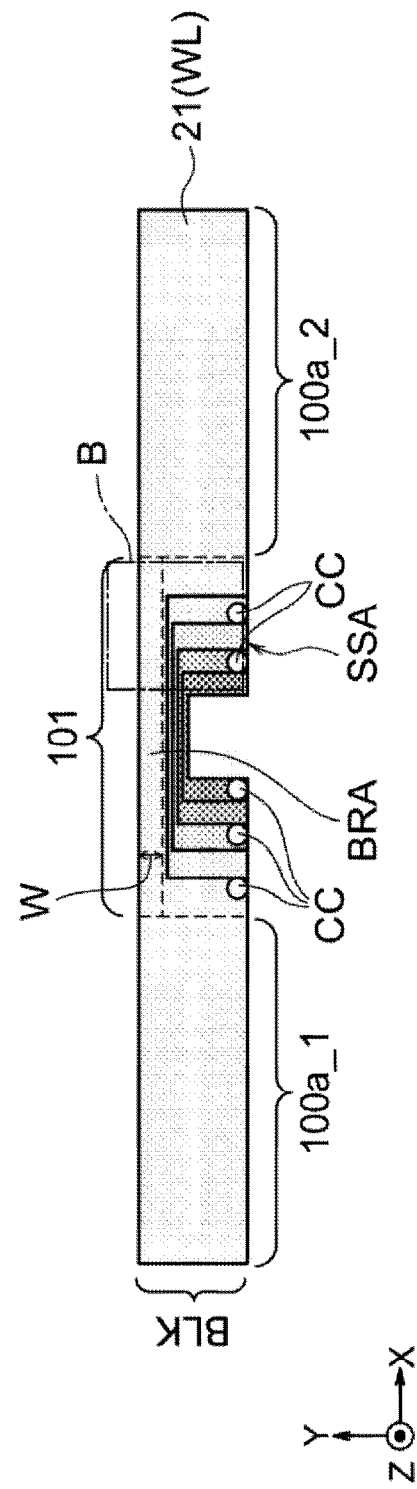

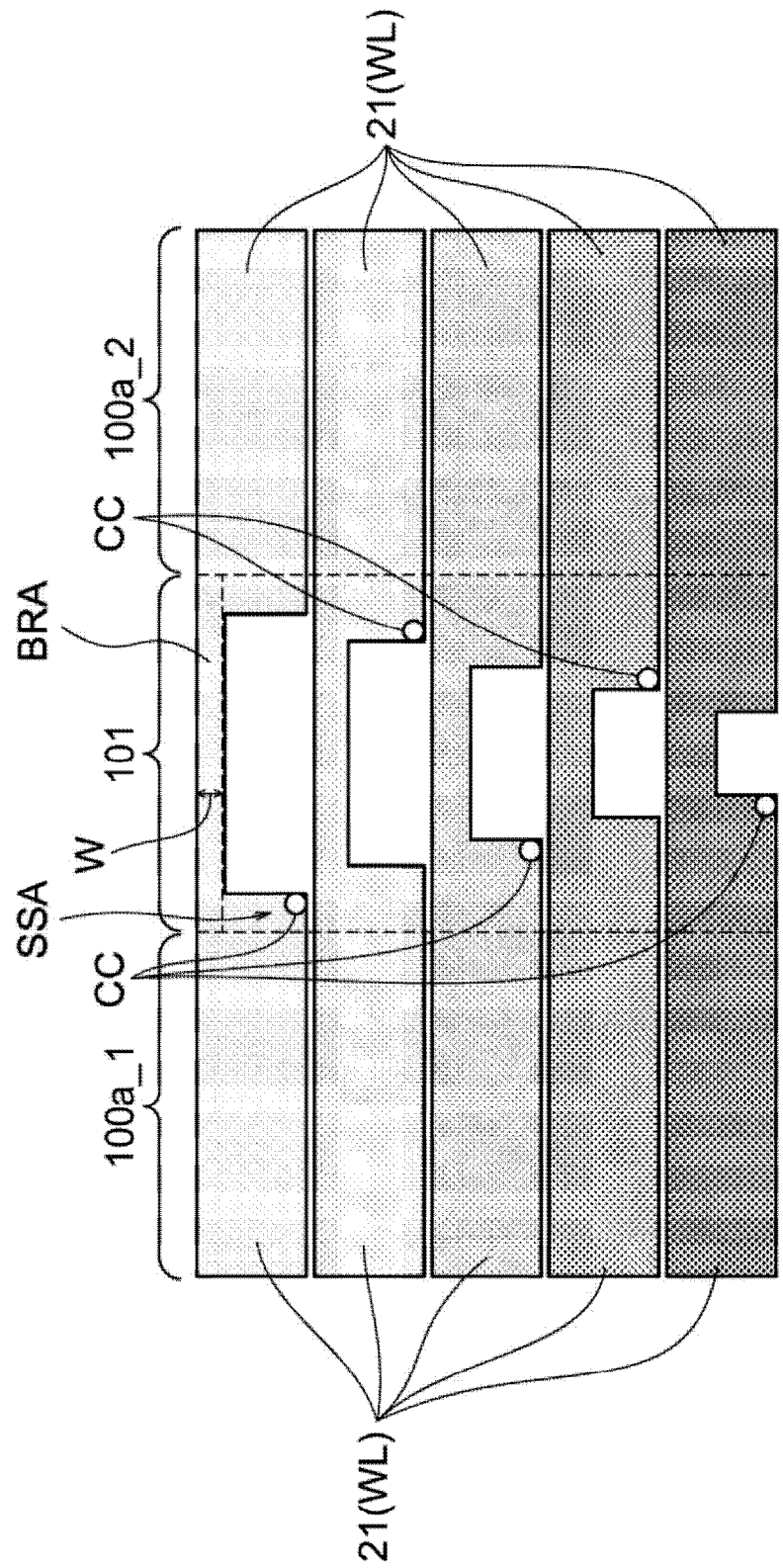

US 12,041,772 B2

SEMICONDUCTOR STORAGE DEVICE

CROSS-REFERENCE TO RELATED APPLICATION

This application is based upon and claims the benefit of priority from Japanese Patent Application No. 2021-017321, filed Feb. 5, 2021, the entire contents of which are incorporated herein by reference.

FIELD

Embodiments described herein relate generally to a semiconductor storage device.

BACKGROUND

A semiconductor storage device such as, for example, a NAND-type flash memory includes a three-dimensional memory cell array. In such a configuration, the memory cell array includes a plurality of memory cells three-dimensionally arranged. With the memory cells arranged in a three-dimensional manner, a high reliability is typically desirable for the memory cell array, while not deteriorating the voltage controllability of a word line.

DESCRIPTION OF THE DRAWINGS

FIG. 8A is a plan view more specifically illustrating several conductive layers of the connection region.

FIG. 8B is a plan view more specifically illustrating the several conductive layers of the connection region.

DETAILED DESCRIPTION

Figure 1:
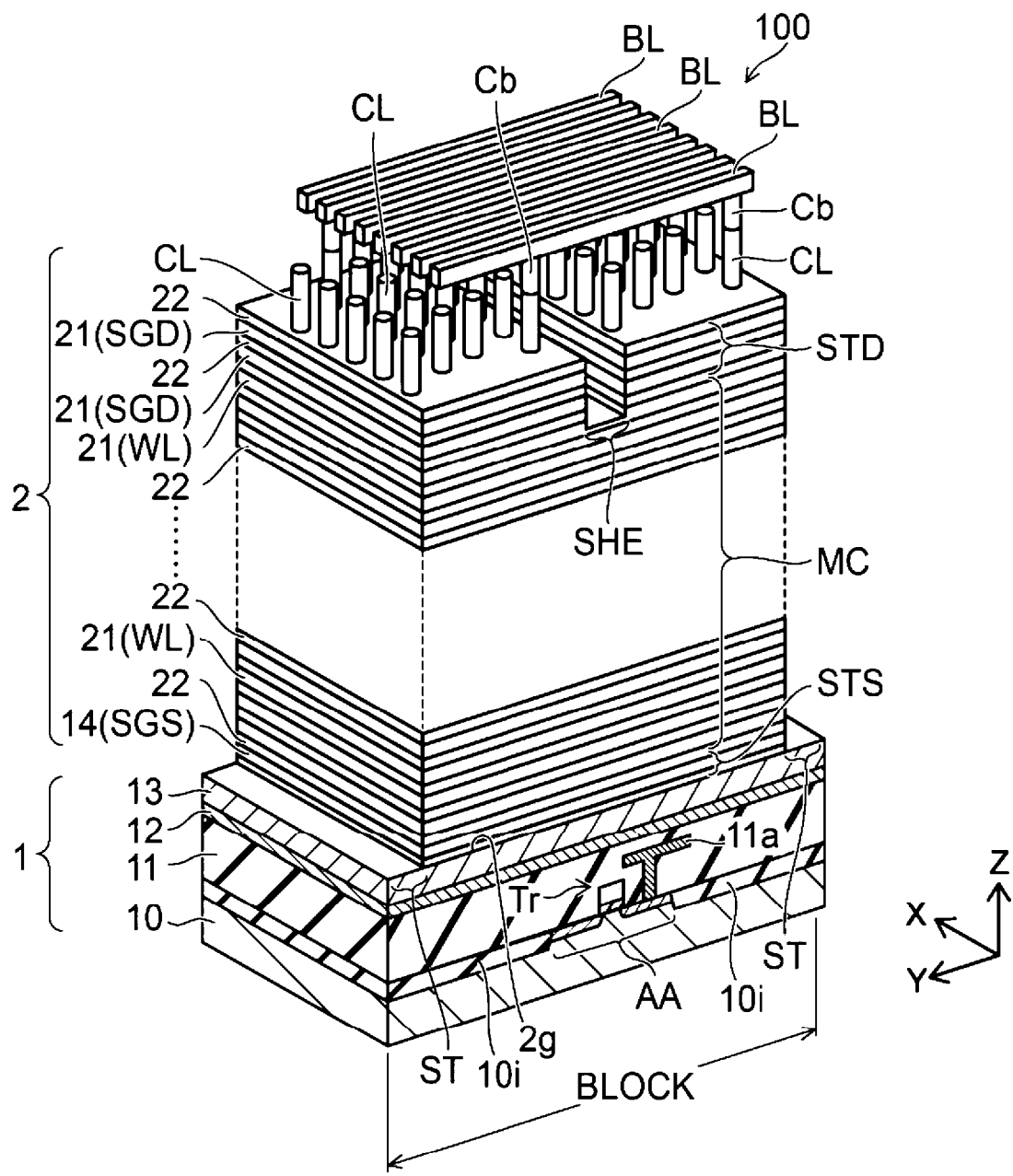
FIG. 1 is a perspective view illustrating a semiconductor device according to a first embodiment.

Embodiments provide a highly reliable semiconductor storage device without deteriorating the voltage controllability of a word line.

In general, according to one embodiment, a semiconductor storage device includes a first region that includes a plurality of first conductive layers separated from each other in a first direction, first semiconductor pillars extending through the plurality of first conductive layers in the first direction, and memory cells formed at respective intersections between the plurality of first conductive layers and the first semiconductor pillars. The semiconductor storage device includes a second region that includes a plurality of second conductive layers separated from each other in the first direction, second semiconductor pillars extending through the plurality of second conductive layers in the first direction, and memory cells formed at respective intersections between the plurality of second conductive layers and the second semiconductor pillars. The semiconductor storage device includes a third region that includes a plurality of third conductive layers separated from each other in the first direction and a plurality of insulator columns extending through the plurality of third conductive layers in the first direction. The third region is disposed between the first region and the second region in a second direction intersecting the first direction, and at least one layer of the plurality of third conductive layers extends from one of the plurality of first conductive layers and one of the plurality of second conductive layers. The third region includes a fourth region and a fifth region, wherein, in the fourth region, the at least one third conductive layer electrically connects the one of the plurality of first conductive layers and the one of the plurality of second conductive layers to each other, and wherein in the fifth region, the at least one third conductive layer is connected to a contact plug. A first diameter of a first subset of the plurality of insulator columns provided in the fourth region is smaller than a second diameter of a second subset of the plurality of insulator columns provided in the fifth region.

Hereinafter, embodiments of the present disclosure will be described with reference to the drawings. The present embodiment is not intended to limit the present disclosure. In the following embodiments, the vertical direction of the semiconductor substrate indicates a relative direction when the surface where the semiconductor element is provided faces upward, and may be different from the vertical direction according to the gravitational acceleration. The drawings are schematic or conceptual, and it cannot say that the ratio of each part is not always the same as the actual one. In the specification and the drawings, the same elements as those already described with respect to the existing drawings are designated by the same reference numerals, and detailed description thereof are omitted as appropriate.

Figure 2:
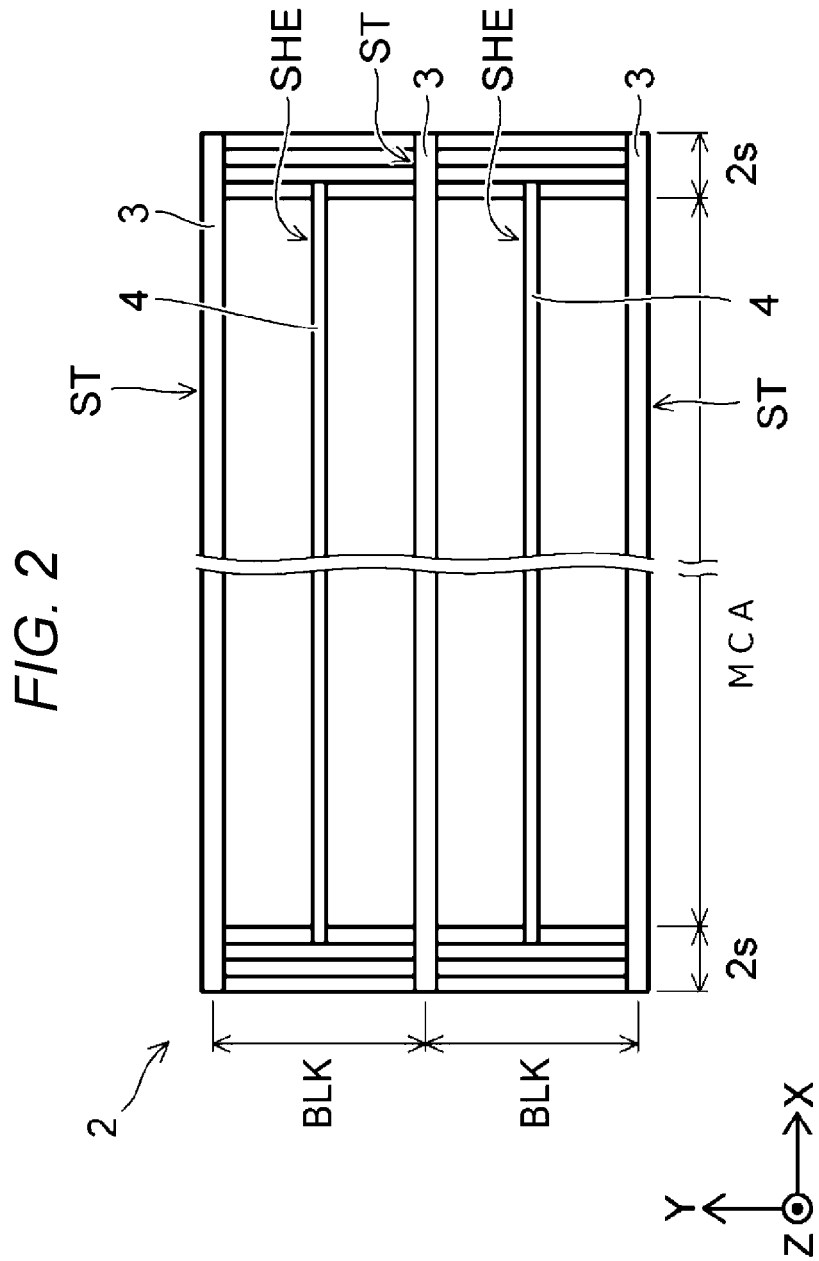
FIG. 2 is a plan view illustrating a stacked body.
Figure 3:
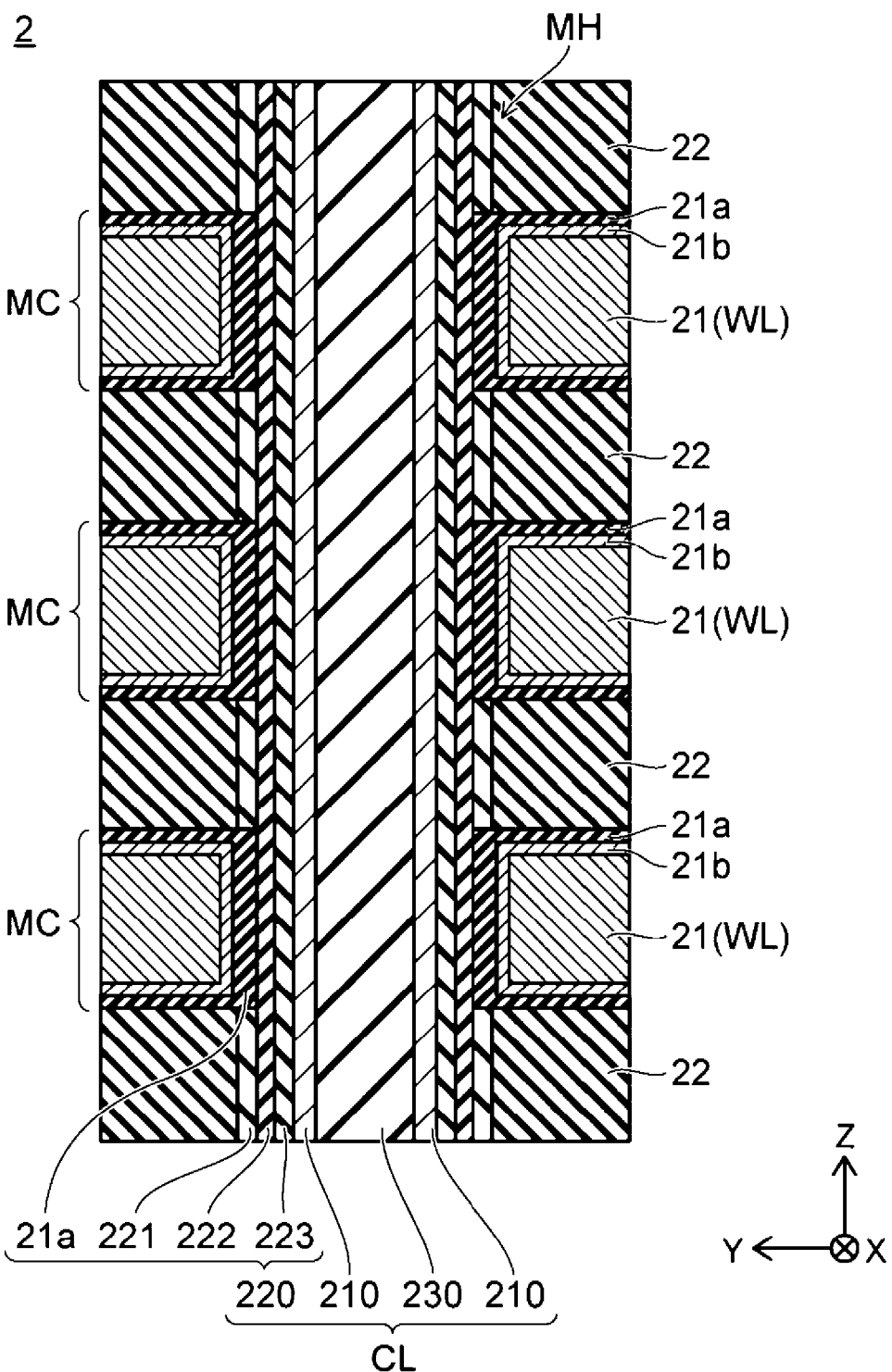
FIG. 3 is a cross-sectional view illustrating an example of a memory cell with a three-dimensional structure.
Figure 4:
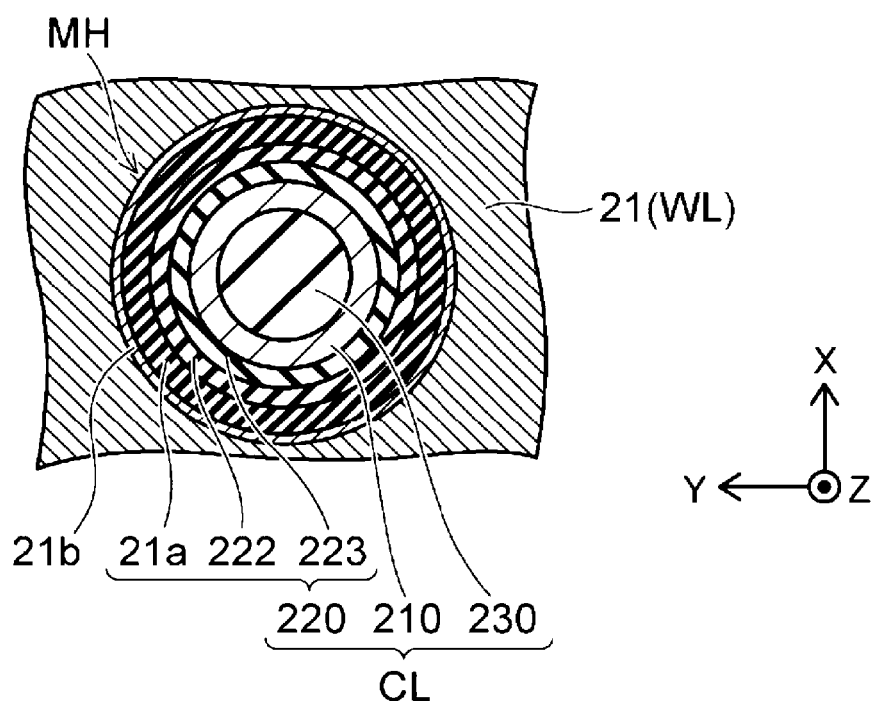
FIG. 4 is a cross-sectional view illustrating an example of the memory cell with a three-dimensional structure.
Figure 5:
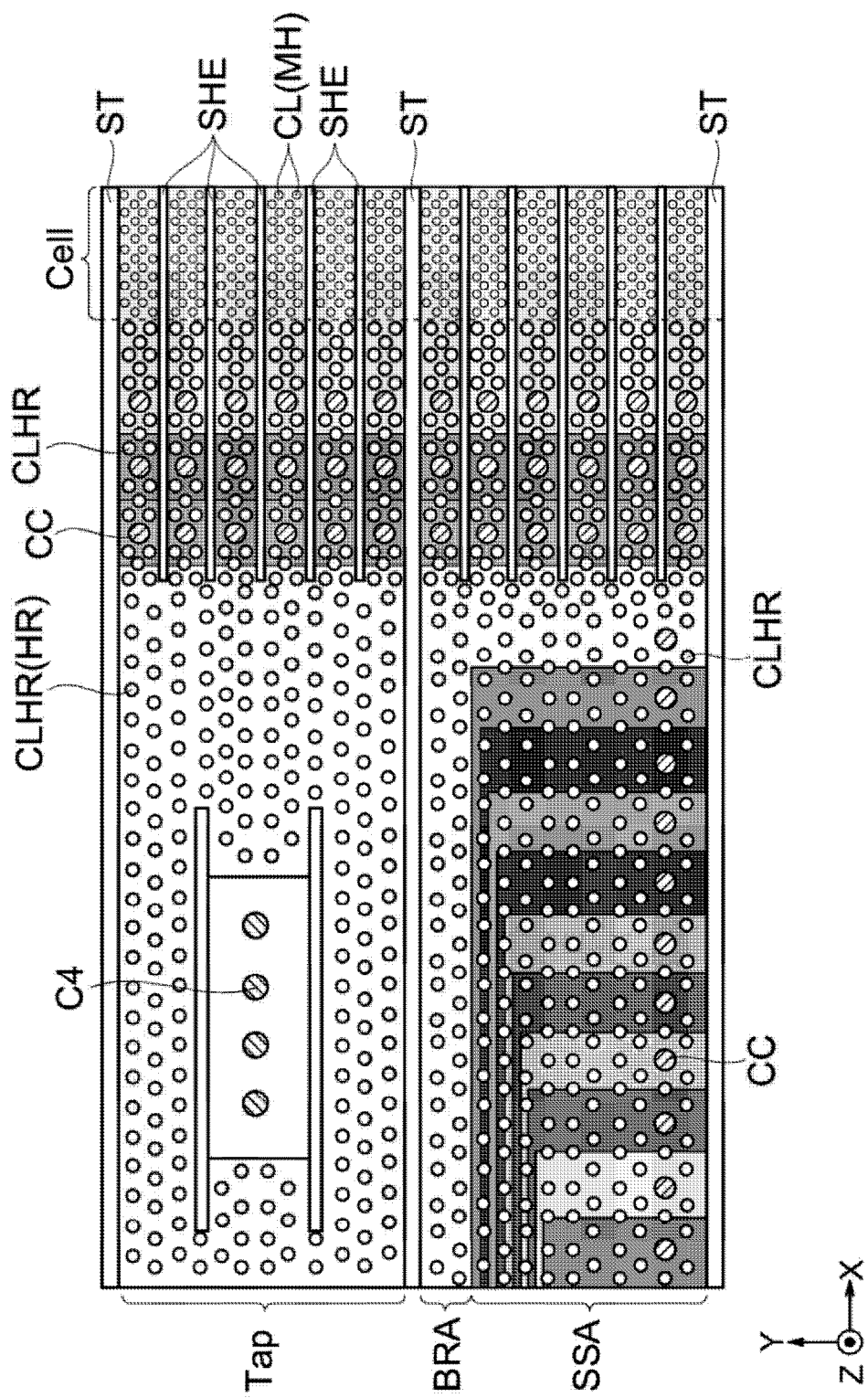
FIG. 5 is a plan view illustrating an example of the semiconductor device according to the first embodiment.

FIG. 1 is a perspective view illustrating a semiconductor storage device 100 according to the first embodiment. FIG. 2 is a plan view illustrating a stacked body 2. In the present specification, a stacking direction of the stacked body 2 is set as a Z axis direction. One direction orthogonal to the Z axis direction is set as a Y axis direction. The direction orthogonal to both of the Z and Y axis directions is set as the X axis direction. FIGS. 3 and 4 each are a cross-sectional view illustrating an example of the memory cell with a three-dimensional structure. FIG. 5 is a plan view illustrating an example of the semiconductor storage device 100 according to the first embodiment. As illustrated in FIGS. 1 to 5, the semiconductor storage device 100 according to the first embodiment is a nonvolatile memory including the memory cell array with the three-dimensional structure.

The semiconductor storage device 100 includes a base portion 1, the stacked body 2, a plate-shaped portion 3, a plurality of columnar portions CL, and a plurality of insulator columns CLHR.

The base portion 1 includes a semiconductor wafer (substrate) 10, an insulating film 11, a conductive film 12, and a semiconductor portion 13. The insulating film 11 is provided on the semiconductor wafer 10. The conductive film 12 is provided on the insulating film 11. The semiconductor portion 13 is provided on the conductive film 12. The semiconductor wafer 10 is, for example, a silicon wafer. The conductivity type of the semiconductor wafer 10 is, for example, a p type. For example, an element isolation area 10i is provided in the front surface region of the semiconductor wafer 10. The element isolation area 10i is, for example, an insulation region including a silicon oxide film, and regulates an active area AA in the front surface region of the semiconductor wafer 10. Source and drain regions of a transistor Tr are provided in the active area AA. The transistor Tr configures a Complementary Metal Oxide Semiconductor (CMOS) circuit as a control circuit of the nonvolatile memory. The insulating film 11 includes, for example, a silicon oxide film and insulates the transistor Tr. Wiring 11a is provided in the insulating film 11. The wiring 11a is electrically connected to the transistor Tr. The conductive film 12 includes, for example, a conductive metal such as tungsten (W). The semiconductor portion 13 includes, for example, n-type silicon. A portion of the semiconductor portion 13 may include undoped silicon.

The stacked body 2 is positioned above the semiconductor portion 13 in the Z axis direction. The stacked body 2 is configured by alternately stacking a plurality of conductive layers 21 as a plurality of first conductive layers and a plurality of insulating layers 22 as a plurality of first insulating layers in the Z axis direction. The plurality of conductive layers 21 are stacked with the insulating layers 22 interposed therebetween at a distance. The conductive layer 21 includes conductive metal, for example, tungsten. The insulating layer 22 includes, for example, silicon oxide. The insulating layer 22 insulates the conductive layers 21 from each other. The number of stacking layers of each of the conductive layers 21 and the insulating layers 22 may be freely set. The insulating layer 22 may be, for example, a gap. For example, an insulating film 2g is provided between the stacked body 2 and the semiconductor portion 13. The insulating film 2g includes, for example, a silicon oxide film. The insulating film 2g may include a high dielectric material with a higher relative permittivity than the silicon oxide. The high dielectric material may be, for example, oxide such as a hafnium oxide film.

The conductive layers 21 includes at least one source-side select gate SGS, a plurality of word lines WL, and at least one drain-side select gate SGD. The source-side select gate SGS is a gate electrode of a source-side select transistor STS. The word line WL is a gate electrode of a memory cell MC. The drain-side select gate SGD is a gate electrode of a drain-side select transistor STD. The source-side select gate SGS is provided in a lower region of the stacked body 2. The drain-side select gates SGD are provided in the upper region of the stacked body 2. The lower region indicates a region of the stacked body 2 that is close to the base portion 1, and the upper region indicates a region of the stacked body 2 that is far from the base portion 1. The word line WL is provided between the source-side select gate SGS and the drain-side select gate SGD.

Among the plurality of insulating layers 22, the thickness of the insulating layer 22 that insulates the source-side select gate SGS and the word line WL from each other in the Z axis direction may be thicker, for example, than the thickness of the insulating layer 22 that insulates the word line WL and the word line WL from each other in the Z axis direction. Further, a cover insulating film may be provided on the uppermost insulating layer 22 that is farthest from the base portion 1. The cover insulating film includes, for example, silicon oxide.

The semiconductor storage device 100 includes the plurality of memory cells MC that are connected to each other in series between the source-side select transistor STS and the drain-side select transistor STD. The structure in which the source-side select transistor STS, the memory cells MC, and the drain-side select transistor STD are connected in series is referred to as a "memory string", or a "NAND string". The memory string is connected to bit lines BL, for example, via contacts Cb. The bit line BL is provided above the stacked body 2 and extends in the Y axis direction.

A plurality of deep slits ST and a plurality of shallow slits SHE are provided in the stacked body 2. As illustrated in FIG. 2, the slits ST extends in the X axis direction in the plane layout. In addition, in the cross section in the Z direction (stacking direction), the slits ST penetrates the stacked body 2 from the upper end of the stacked body 2 to the base portion 1 in the stacked body 2, and is provided in the stacked body 2. The plate-shaped portions 3 of FIG. 2 are provided in the slits ST. For example, an insulating film such as a silicon oxide film is used in the plate-shaped portion 3. Or, the plate-shaped portion 3 may be configured with conductive metal such as a conductive material electrically connected to the semiconductor portion 13 (for example, tungsten or copper) and electrically insulated from the stacked body 2 by the insulating film. The slits SHE extends in the X axis direction substantially parallel to the slits ST in the plane layout. In addition, in the cross section in the Z direction, the slits SHE are provided from the upper end of the stacked body 2 to the middle of the stacked body 2. For example, an insulator 4 is provided in the slit SHE. For example, an insulating film such as a silicon oxide film is used in the insulator 4.

As illustrated in FIG. 2, the stacked body 2 includes step portions 2s and a memory cell array MCA. The step portions 2s are provided at the edge of the stacked body 2. The memory cell array MCA is interposed between or surrounded by the step portions 2s. The slits ST are provided from the step portion 2s of one end of the stacked body 2 to the step portion 2s of the other end of the stacked body 2 via the memory cell array MCA. The slits SHE are at least provided in the memory cell array MCA.

A portion of the stacked body 2 interposed between the two slits ST (the plate-shaped portions 3) is referred to as a block BLK. The block configures, for example, the smallest unit of data erasure. The slits SHE (the insulators 4) are provided in the block. The stacked body 2 between the slit ST and the slit SHE is referred to as a finger. The drain-side select gate SGD is separated for each finger. Therefore, during writing and reading data, one finger in a block can be brought in a selected state by the drain-side select gates SGD.

Figure 6:
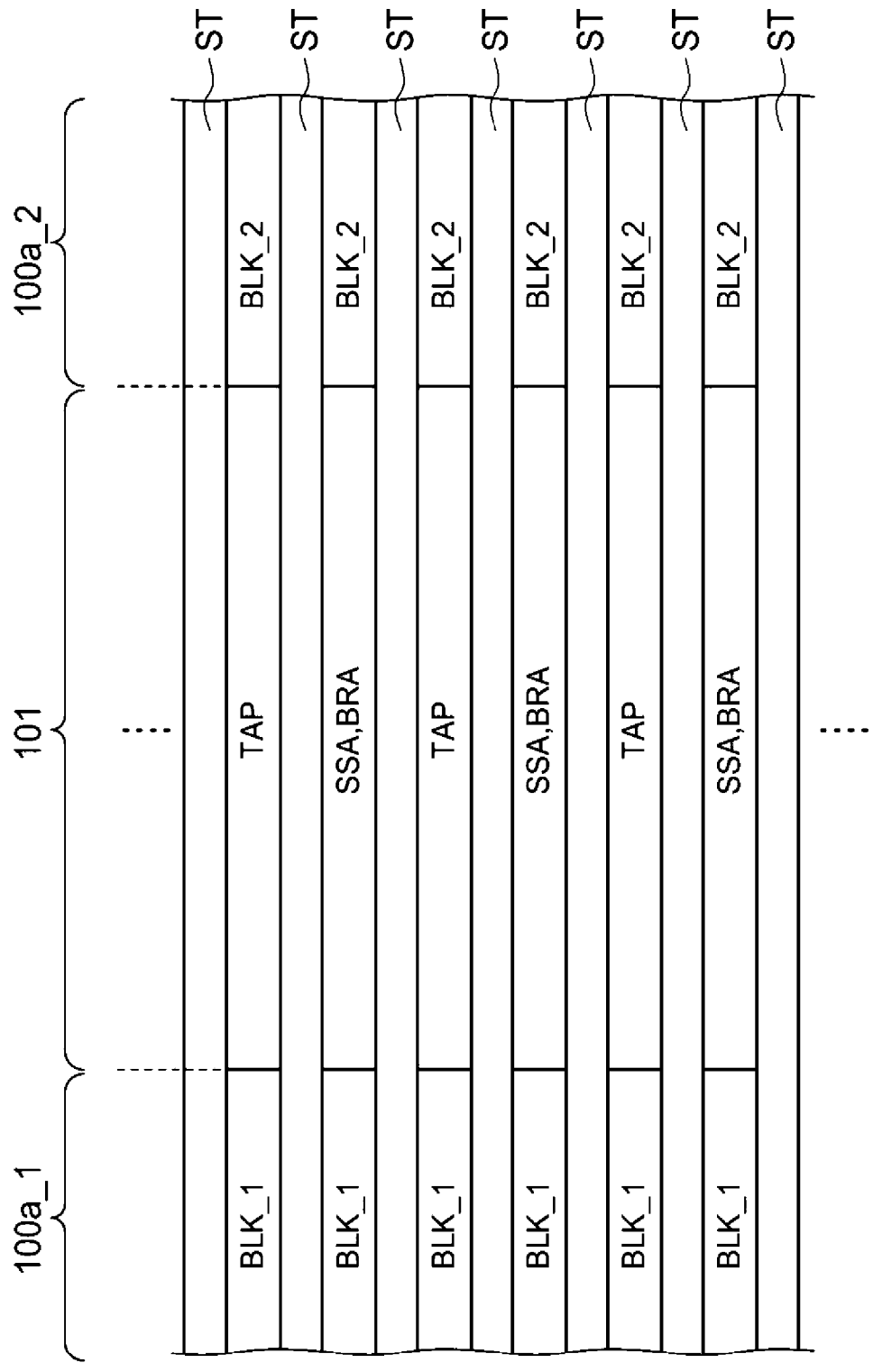
FIG. 6 is a schematic plan view illustrating a layout of a connection region and a memory cell region.

As illustrated in FIG. 5, the memory cell array MCA includes a cell area Cell and the other areas. In the cell area Cell, the plurality of columnar portions CL are provided in memory holes MH. In the areas other than the cell area Cell, a tap area Tap, a step area SSA, and abridge area BRA are provided. The tap area Tap is provided in the block BLK adjacent to the step area SSA and the bridge area BRA with the slits ST interposed therebetween in the Y direction. As illustrated in FIG. 6, the tap area Tap may be provided between the cell areas in the X direction. The step area SSA and the bridge area BRA may be also provided between the cell areas in the X direction. The step area SSA is an area in which a plurality of contact plugs CC are provided. As illustrated in FIG. 6, the bridge areas BRA are provided in order to electrically connect wiring layers of the word lines WL of the blocks BLK adjacent in the X direction with the step areas SSA interposed therebetween. The tap area Tap is an area in which contact plugs C4 are provided. Each of the contact plugs CC and C4 extends, for example, in the Z axis direction. Each of the contact plugs CC is electrically connected, for example, to the conductive layer 21. The contact plug C4 is electrically connected, for example, to the wiring 11a in order to supply power to the transistor Tr. For example, low resistance metal such as copper or tungsten is used in the contact plugs CC and C4.

Around each of the contact plugs CC and C4, insulating films (not illustrated) are provided. Therefore, the contact plugs CC and C4 and the stacked body 2 are electrically insulated from each other. Accordingly, while the contact plugs CC and C4 are insulated from the stacked body 2, wiring or the like above the stacked body 2 can be electrically connected to wiring or the like below the stacked body 2. In the insulating film, for example, an insulating film such as a silicon oxide film is used.

The plurality of columnar portions CL are each provided in the memory holes MH provided in the stacked body 2. The memory holes MH penetrate the stacked body 2 from the upper end of the stacked body 2 in the stacking direction of the stacked body 2 (Z axis direction) and extends into the stacked body 2 and into the semiconductor portion 13. As illustrated in FIGS. 3 and 4, the plurality of columnar portions CL each include a semiconductor body 210, a memory film 220, and a core layer 230, as a semiconductor pillar. The semiconductor body 210 extends in the stacking direction (Z direction) in the stacked body 2 and is electrically connected to the semiconductor portion 13. The memory film 220 includes a charge capturing portion between the semiconductor body 210 and the conductive layers 21. The plurality of columnar portions CL that are selected from the fingers one by one are commonly connected to one bit line BL via the contacts Cb. The columnar portions CL are each provided, for example, in the cell area (Cell) of FIG. 5.

As illustrated in FIGS. 3 and 4, the shape of the memory hole MH in the X-Y plane is, for example, a circle or an ellipse. Block insulating films 21a that configure a portion of the memory film 220 may be provided between the conductive layers 21 and the insulating layers 22. The block insulating film 21a is, for example, a silicon oxide film or a metal oxide film. One example of the metal oxide is aluminum oxide. Barrier films 21b may be provided between the conductive layers 21 and the insulating layers 22 and between the conductive layers 21 and the memory film 220. If the conductive layer 21 is, for example, tungsten, for example, a stacked structure film of titanium nitride and titanium is selected as the barrier film 21b. The block insulating film 21a prevents back tunneling of charges from the conductive layer 21 to the memory film 220. The barrier film 21b improves the adhesion between the conductive layer 21 and the block insulating film 21a.

The shape of the semiconductor body 210 is, for example, a tubular shape. The semiconductor body 210 includes, for example, silicon. The silicon is, for example, polysilicon obtained by crystallizing amorphous silicon. The semiconductor body 210 is, for example, undoped silicon. In addition, the semiconductor body 210 may be p-type silicon. The semiconductor bodies 210 become channels of each of the drain-side select transistor STD, the memory cells MC, and the source-side select transistor STS.

Portions of the memory film 220 other than the block insulating films 21a are provided between the inner surfaces of the memory holes MH and the semiconductor body 210. The shape of the memory film 220 is, for example, a tubular shape. The plurality of memory cells MC include storage regions between the semiconductor body 210 and the conductive layers 21 that are the word lines WL, and are stacked in the Z axis direction. The memory film 220 includes, for example, a cover insulating film 221, a charge capturing film 222, and a tunnel insulating film 223. Each of the semiconductor bodies 210, the charge capturing film 222, and the tunnel insulating film 223 extends in the Z axis direction.

The cover insulating film 221 is provided between the insulating layers 22 and the charge capturing film 222. In the cover insulating film 221, for example, silicon oxide is used. The cover insulating film 221 is provided so that the charge capturing film 222 is not etched when a sacrificial film provided between the insulating layers 22 is replaced with the conductive layer 21 in a manufacturing process. In the replacement step, the cover insulating film 221 may be removed from a portion between the conductive layers 21 and the memory film 220. In this case, as illustrated in FIGS. 3 and 4, for example, the block insulating films 21a are provided between the conductive layers 21 and the charge capturing film 222. In the formation of the conductive layers 21, when the replacement step is not used, the cover insulating film 221 may not be provided.

The charge capturing film 222 is provided between the block insulating films 21a and the cover insulating film 221 and the tunnel insulating film 223. The charge capturing film 222 includes, for example, silicon nitride, and includes a trap site that traps charges in the film. In the charge capturing film 222, portions interposed between the conductive layers 21 that are the word lines WL and the semiconductor body 210 configure storage regions of the memory cells MC as the charge capturing portions. The threshold voltage of the memory cell MC changes according to the presence of charges in the charge capturing portion or the amount of charges captured in the charge capturing portion. Accordingly, the memory cell MC can store information.

The tunnel insulating film 223 is provided between the semiconductor body 210 and the charge capturing film 222. For example, silicon oxide or silicon oxide and silicon nitride are used in the tunnel insulating film 223. The tunnel insulating film 223 is a potential barrier between the semiconductor body 210 and the charge capturing film 222. For example, when electrons are injected from the semiconductor body 210 to the charge capturing portion (write operation), and when holes are injected from the semiconductor body 210 to the charge capturing portion (erase operation), the electrons and the holes each pass through the potential barrier of the tunnel insulating film 223 (tunneling).

The core layer 230 embeds the internal space of the tubular semiconductor body 210. The shape of the core layer 230 is, for example, a columnar shape. For example, an insulating film such as a silicon oxide film is used in the core layer 230.

The plurality of insulator columns CLHR illustrated in FIG. 5 are each provided in holes HR provided in the stacked body 2. The holes HR penetrate the stacked body 2 from the upper end of the stacked body 2 in the Z axis direction and provided into the stacked body 2 and into the semiconductor portion 13. For example, an insulator such as a silicon oxide film is used in the insulator column CLHR. In addition, each of the insulator columns CLHR has the same structure as the columnar portion CL. The insulator columns CLHR are each provided, for example, in the tap areas Tap, the step areas SSA, and the bridge areas BRA. When the sacrificial film (not illustrated) is replaced with the conductive layer 21 (replacement step), the insulator columns CLHR function as support members to hold gaps formed in the step area and the tap area. The hole HR of the insulator column CLHR has larger diameter (the width in the X direction or the Y direction) than the columnar portion CL.

As illustrated in FIG. 1, the semiconductor storage device 100 further includes a semiconductor portion 14. The semiconductor portion 14 positions between the stacked body 2 and the semiconductor portion 13. The semiconductor portion 14 is provided between the insulating film 2g and the insulating layer 22 which is the closest to the semiconductor portion 13 among the insulating layers 22. The conductivity type of the semiconductor portion 14 is an n type. The semiconductor portion 14 functions, for example, as the source-side select gate SGS.

FIG. 6 is a schematic plan view illustrating the layout of a connection region 101 and memory cell regions 100a. The memory cell regions 100a include a first memory cell region 100a_1 and a second memory cell region 100a_2 adjacent to each other. The first memory cell region 100a_1 and the second memory cell region 100a_2 each include the plurality of blocks BLK. In the Y direction, the plurality of blocks BLK each are separated by the slits ST extending in the X direction.

Both the first memory cell region 100a_1 and the second memory cell region 100a_2 include the plurality of columnar portions CL (the memory holes MH) and include a plurality of memory cells that are three-dimensionally arranged. The memory cells are formed at the intersections between the plurality of word lines WL and the columnar portions CL.

For convenience, the block BLK belonging to the first memory cell region 100a_1 is indicated by a block BLK 1. In addition, the block BLK belonging to the second memory cell region 100a_2 is indicated by a block BLK 2.

The connection region 101 is provided between the first memory cell region 100a_1 and the second memory cell region 100a_2 in the X direction intersecting the Z direction and includes the tap areas Tap, the step areas SSA, and the bridge areas BRA for each of the blocks BLK. Hereinafter, the step areas SSA and the bridge areas BRA are referred to as the step areas SSA and the like.

As described above, the tap areas Tap, the step areas SSA, and the like are adjacent to each other in the Y direction via the slits ST. As illustrated in FIG. 6, the tap areas Tap, the step areas SSA, and the like are alternately provided in the Y direction. Though not illustrated, the tap areas Tap, the step areas SSA, and the like are alternately provided in the X direction. That is, the tap areas Tap, the step areas SSA, and the like are alternately provided in the Y direction with the slits ST interposed therebetween and are alternately provided in the X direction with the cell areas Cell (the blocks BLK) interposed therebetween.

In the step area SSA, end portions of the select gate line (source-side select gate) SGS and the plurality of word lines WL are each provided in steps sequentially from the lower layer in the X direction and formed in the step shape. In other words, in the step area SSA, each of the select gate line SGS and the plurality of word lines WL includes a terrace portion (also referred to as a step, a step portion, and a drawer portion) that does not overlap with a wiring layer (conductive layer) of a lower layer at the end portion. The contact plugs CC of FIG. 5 are formed on each terrace portion. The select gate line SGS and the plurality of word lines WL can be separately applied with voltages via the contact plugs CC. In this manner, the step areas SSA are provided as the terrace areas to connect a plurality of contacts to each of a plurality of conductive layers connected to the select gate line SGS and the plurality of word lines WL.

Further, the contact plug CC is electrically connected to the contact plug C4 of the tap area of FIG. 5 via the upper layer wiring (not illustrated) and electrically connected to a row decoder provided under the memory cell array via the contact plug C4. Accordingly, the row decoder can control the voltages of the conductive layers 21 (the word lines WL) via the contact plugs CC. The diameters of the contact plugs CC and C4 are larger than the diameter of the insulator column CLHR.

A plurality of third conductive layers each corresponding to one of the select gate line SGS and the plurality of word lines WL are stacked in the bridge areas BRA at distances from each other in the Z direction. The third conductive layers each electrically connect the conductive layers 21 (the select gate line SGS and the plurality of word lines WL) of the first memory cell region 100a_1 and the conductive layers 21 (the select gate line SGS and the plurality of word lines WL) of the second memory cell region 100a_2 to each other. Accordingly, the first and second memory cell regions 100a_1 and 100a_2 can function as one memory cell array MCA.

In this manner, the connection region 101 is disposed in an intermediate portion of the memory cell array MCA, so that the contact plugs CC are positioned in the middle of the wirings of the word lines WL, and distances from the contact plugs CC to the end portion of the word lines WL can be shortened. Accordingly, the semiconductor storage device 100 can quickly supply power to the end portions of the word lines WL via the contact plugs CC and facilitate the voltage control of the word lines WL. In addition, the memory cell regions 100a_1 and 100a_2 can be arranged on both sides of one connection region 101, and thus the scale (storage capacitance) of the memory cell array MCA can be increased while maintaining the operation speed.

The bridge areas BRA have the same structures of the stacked bodies as the first and second memory cell regions 100a_1 and 100a_2. Accordingly, the stacked bodies of the bridge areas BRA are configured by alternately stacking the plurality of conductive layers 21 and the plurality of insulating layers 22 in the Z axis direction. That is, the plurality of conductive layers 21 as the plurality of third conductive layers are stacked at a distance from each other with the insulating layers 22 interposed therebetween. As described above, the insulating layers 22 may be air gaps.

Figure 7A:
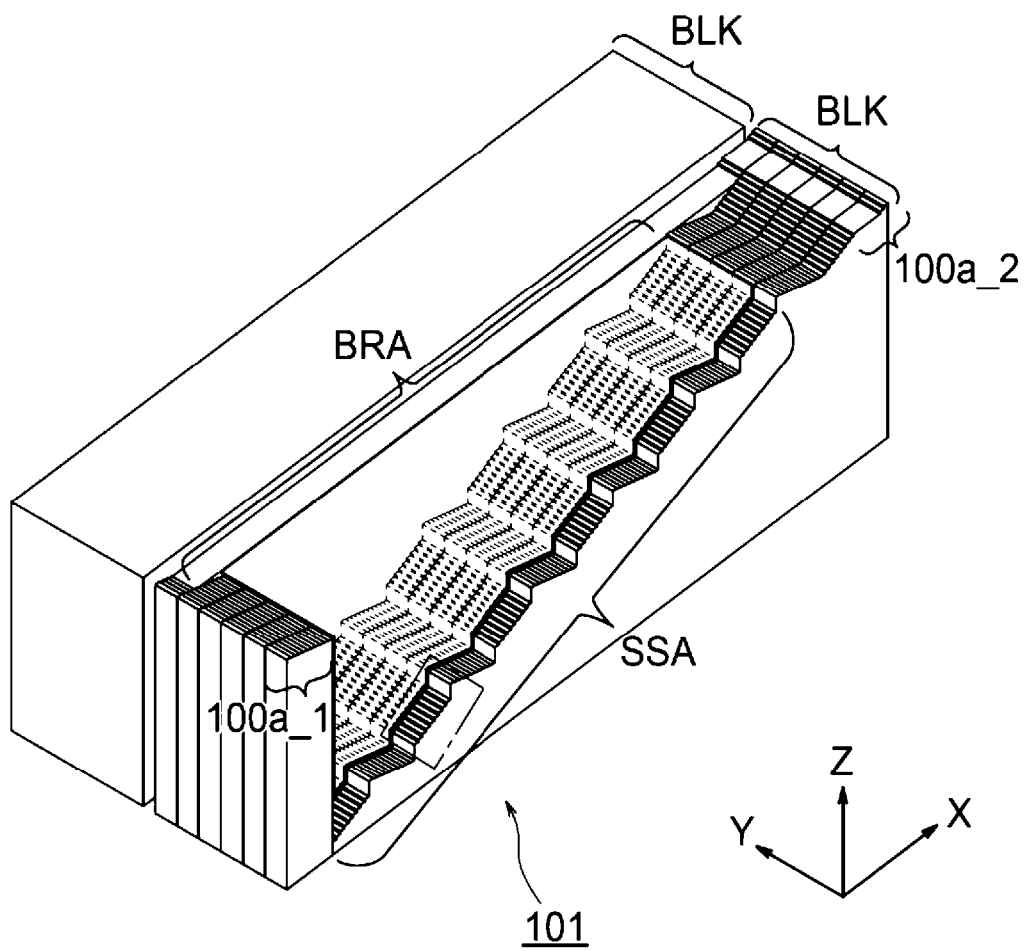
FIG. 7A is a perspective view schematically illustrating a connection region of blocks.
Figure 7B:
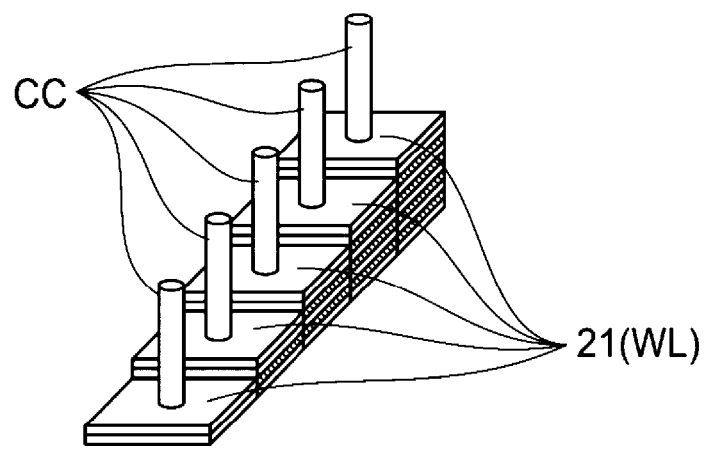
FIG. 7B is a perspective view schematically illustrating the connection region of the blocks.

FIGS. 7A and 7B are perspective views schematically illustrating the connection region 101 of a certain block BLK. The step area SSA of the connection region 101 is provided in a step shape in order to connect the plurality of contact plugs CC to each of the plurality of conductive layers 21 (the word lines WL). In the bridge area BRA, the plurality of conductive layers 21 electrically connect the conductive layers 21 (the word lines WL) of the first and second memory cell regions 100a_1 and 100a_2 to each other.

In the connection region 101, the bridge area BRA is provided adjacent to the step area SSA in the Y direction (direction substantially perpendicular to the extension direction of the slit ST), and is not carved in a step shape. Accordingly, the bridge area BRA includes the same number of conductive layers 21 and the same number of insulating layers 22 as those in the stacked bodies 2 of the first and second memory cell regions 100a_1 and 100a_2.

FIGS. 8A and 8B are plan views more specifically illustrating several conductive layers 21 of the connection region 101. FIG. 8A illustrates a state in which the conductive layers 21 are stacked and FIG. 8B separately illustrates respective layers of the conductive layers 21. In FIGS. 8A and 8B, five conductive layers 21 are illustrated. It is obvious that the number of conductive layers 21 may be 4 or less or may be 6 or more. Further, FIGS. 8A and 8B illustrate one block BLK portion, and thus the columnar portions CL (the memory holes MH), the insulator columns CLHR, and the slits SHE as illustrated in FIG. 5 are omitted.

As illustrated in FIG. 8A, the step area SSA of the connection region 101 is formed in a step shape so that the front surfaces (tread surfaces) of the conductive layers 21 are seen in the Z direction. The front surface (tread surface) of the conductive layer 21 has an extent (area) to which the contact plug CC can be connected in the Z direction. In FIG. 8A, the step portions of the step area SSA face the both sides of the connection region 101 in the X direction. As illustrated in FIGS. 8A and 8B, the contact plugs CC are provided on the conductive layers 21 in the step area SSA one by one and are connected to the tread surfaces of the conductive layers 21. For example, in the example illustrated in FIG. 8, the contact plugs CC are alternately connected to the step portions on the left and right sides of the step areas SSA. More specifically, on the uppermost conductive layer 21, the contact plug CC is connected to the tread surface of the step portion on the left side of the step area SSA. On the second conductive layer 21, the contact plug CC is connected to the tread surface of the step portion on the right side of the step area SSA. On the third conductive layer 21, the contact plug CC is connected to the tread surface of the step portion on the left side of the step area SSA. On the fourth conductive layer 21, the contact plug CC is connected to the tread surface of the step portion on the right side of the step area SSA. On the fifth conductive layer 21 (lowermost layer), the contact plug CC is connected to the tread surface of the step portion on the left side of the step area SSA.

Further, the step area SSA may be provided only one side of the connection region 101 in the X direction. In this case, the contact plug CC is connected to the tread surface of the step portion provided on one side of the connection region 101.

Since the contact plugs CC are provided on the conductive layers 21 one by one, the conductive layers 21 of the memory cell regions on sides to which the contact plugs CC are not connected are electrically connected to the contact plugs CC via the bridge areas BRA. For example, the contact plug CC is not provided on the uppermost conductive layer 21 of the second memory cell region 100a_2 on the right side. Therefore, the uppermost conductive layer 21 of the second memory cell region 100a_2 on the right side is electrically connected to the contact plug CC provided on the uppermost conductive layer 21 of the first memory cell region 100a_1 on the left side via the uppermost conductive layer 21 of the bridge area BRA. In addition, the contact plugs CC are not provided on the second conductive layer 21 of the first memory cell region 100a_1 on the left side. Accordingly, the second conductive layer 21 of the first memory cell region 100a_1 on the left side is electrically connected to the contact plug CC provided on the second conductive layer 21 of the second memory cell region 100a_2 on the right side via the second conductive layer 21 of the bridge area BRA. In this manner, any one of the memory cell regions 100a_1 and 100a_2 on both sides of the connection region 101 is electrically connected to the contact plug CC provided on the other side via the bridge area BRA. Therefore, as the resistance of each conductive layer 21 of the bridge area BRA increases, the voltage controllability of the memory cell regions 100a_1 and 100a_2 is deteriorated. Accordingly, the resistance of each conductive layer 21 of the bridge area BRA is preferably low. That is, a width W of the bridge area BRA in the Y direction is preferably wide.

However, if the width W of the bridge area BRA in the Y direction is wide, the step area SSA becomes narrow. In this case, while the depth of the recess in the step area SSA in the Z direction is not changed, the step area SSA becomes narrow, and thus the aspect ratio of the step area SSA increases. Accordingly, when the step area SSA is embedded with a silicon oxide film (for example, TEOS), it is likely that voids are generated in the silicon oxide film. In this case, there is a concern that the contact plug CC short-circuits the other contact plugs CC via the voids.

Here, according to the present embodiment, as illustrated in FIG. 9, the sizes and the arrangement of the insulator columns CLHR are changed in the connection region 101.

Figure 9A:
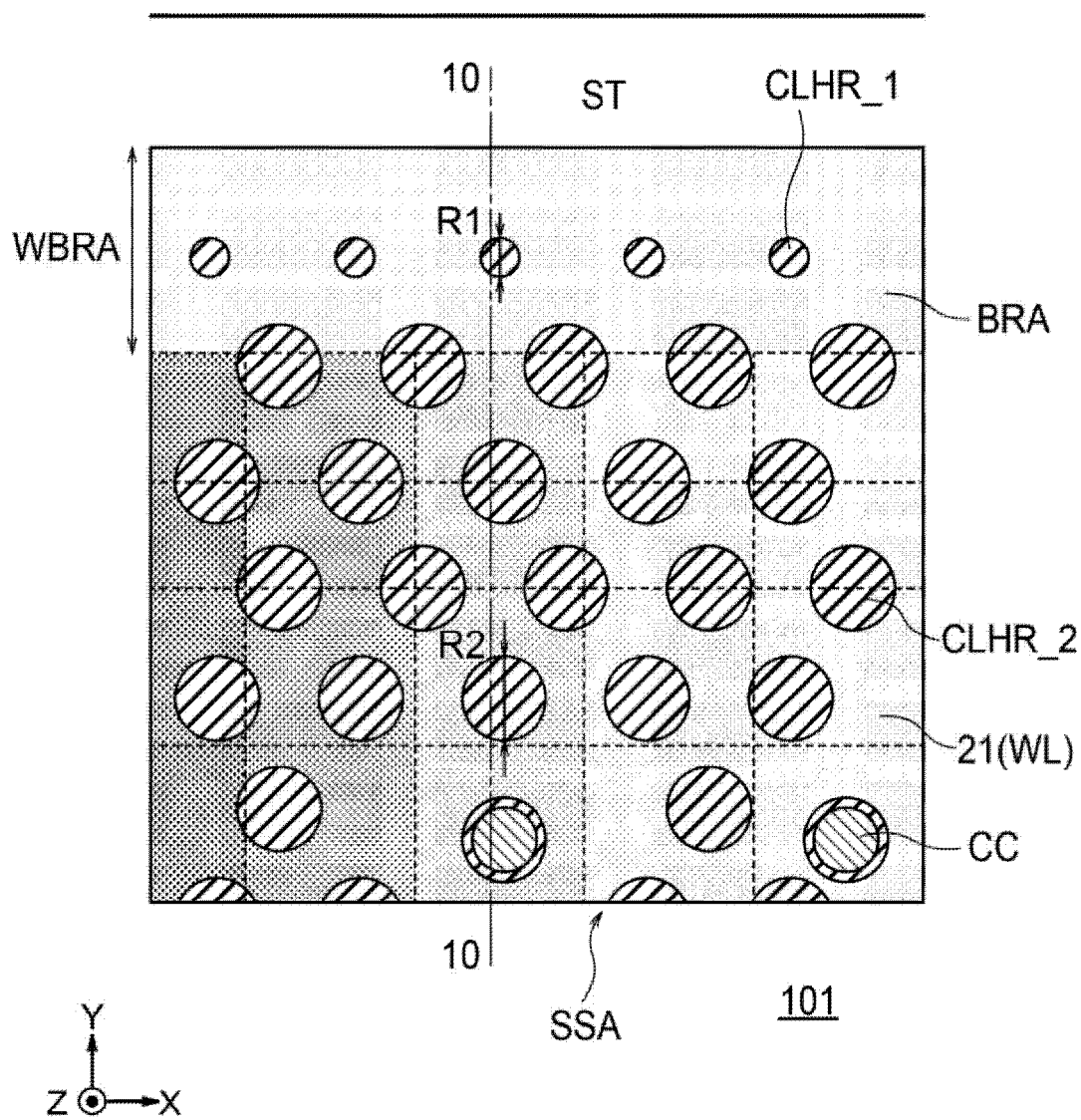
FIG. 9A is an enlarged plan view of a broken line frame B of FIG. 8A.

FIG. 9A is an enlarged plan view of a broken line frame B of FIG. 8A. In FIG. 9A, the insulator columns CLHR illustrated in FIG. 5 are illustrated. The insulator columns CLHR are a plurality of insulator columns that extend in a stacking direction (Z direction) in the bridge areas BRA of the connection region 101 and the stacked bodies of the conductive layers 21 of the step areas SSA. In FIG. 9A, for convenience, the insulator columns CLHR that are provided in the bridge area BRA are referred to as CLHR_1, and the insulator columns CLHR provided in the step area SSA are referred to as CLHR_2.

First, the stacked bodies of the memory cell regions 100a_1 and 100a_2 and the connection region 101 are formed by forming stacked bodies of the insulating layers 22 (for example, silicon oxide films) and sacrificial films (for example, silicon nitride films) and replacing the sacrificial films (not illustrated) with the conductive layers 21 (for example, tungsten). If the sacrificial films are removed in the replacement step of replacing these sacrificial films with the conductive layers 21, gaps for embedding the conductive layers 21 between the insulating layers 22 are formed. The insulator columns CLHR function as support members for holding the gaps between the insulating layers 22 formed in the connection region 101. If there are not the insulator columns CLHR, the insulating layers 22 are not supported, and thus there is a concern that the insulating layers 22 are bent or broken due to the own weights thereof. Accordingly, the insulator columns CLHR are substantially evenly arranged in the connection region 101. Accordingly, in the replacement step of the sacrificial films with the conductive layers 21, the insulator columns CLHR can support the insulating layers 22 to maintain the gaps between the insulating layers 22.

Here, according to the present embodiment, when being seen in the stacking direction of the conductive layers 21 (Z direction), among the insulator columns CLHR, a diameter R1 of the insulator column CLHR_1 provided in the bridge area BRA is smaller than a diameter R2 of the insulator column CLHR_2 provided in the step area SSA. Accordingly, without widening a width WBRA of the conductive layer 21 in the bridge area BRA, the electrical resistance value of the conductive layer 21 of the bridge area BRA can be decreased. By decreasing the resistance values of the conductive layers 21 of the bridge areas BRA, voltage control of the conductive layers 21 (the word lines WL) of the first and second memory cell regions 100a_1 and 100a_2 via the contact plugs CC is facilitated. As a result, the read operation, the write operation, and the erase operation of the selected memory cell can be speeded up. Further, the diameter R1 of the insulator column CLHR_1 is only required to be smaller than the diameter R2 and may be different from each other.

Figure 9B:
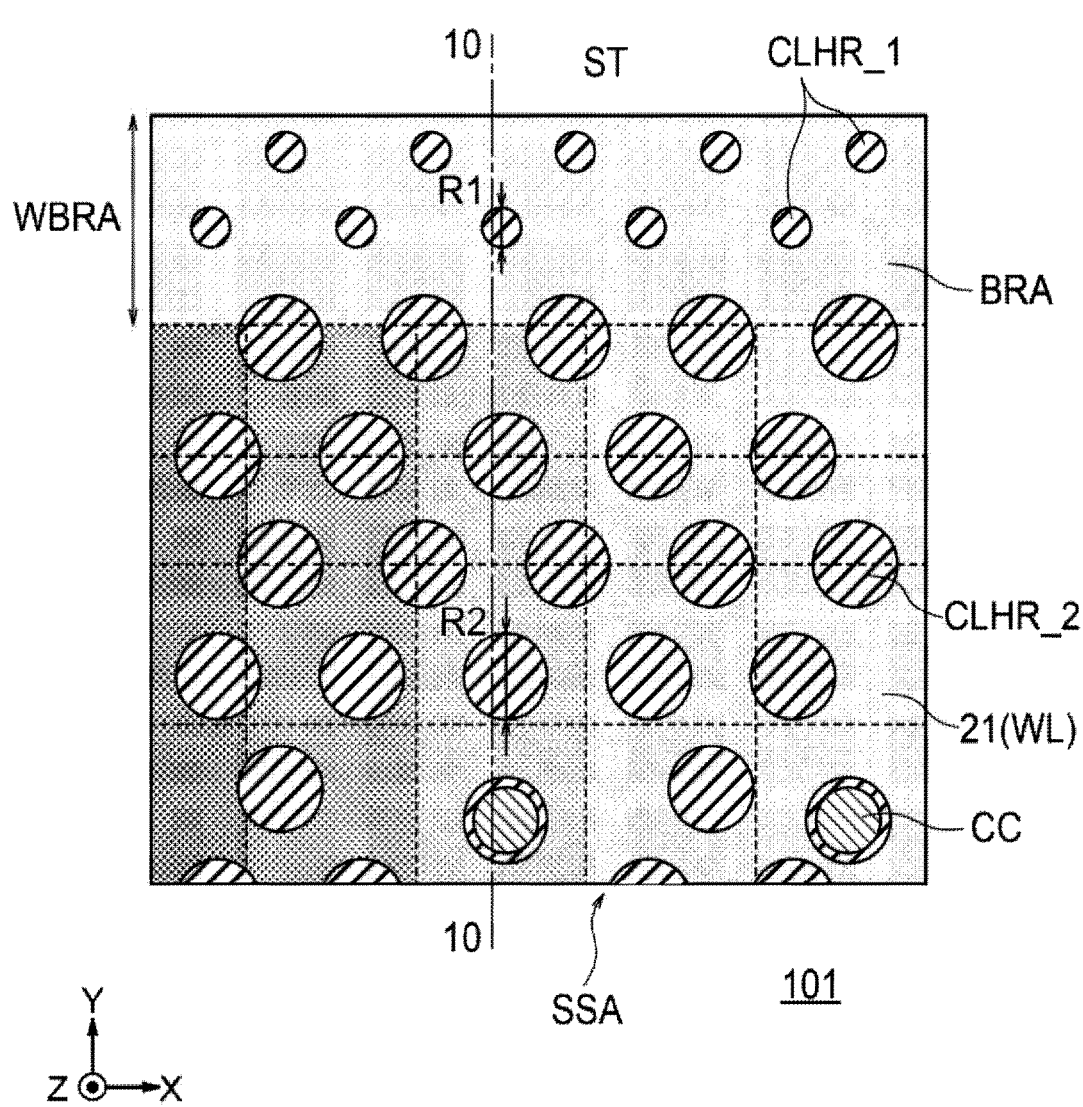
FIG. 9B is a plan view illustrating an example of a bridge area with two rows of insulator columns.

Further, in FIG. 9A, only one row of the insulator columns CLHR_1 arranged in the X direction in which the bridge areas BRA extend overlaps with the bridge areas BRA. However, the insulator columns CLHR_1 that overlap with the bridge area BRA may be a plurality of rows. For example, FIG. 9B is a plan view illustrating an example of the bridge area BRA with two rows of the insulator columns CLHR_1 that extend in the X direction. In this case, the stacked body 2 of the bridge area BRA is supported by the plurality of rows of insulator columns CLHR_1, and thus the conductive layers 21 of the stacked body 2 are more securely supported. By making the diameters R1 of the plurality of rows of insulator columns CLHR_1 smaller than the diameters R2 of the insulator columns CLHR_2 of the step area SSA, the resistance value of the bridge areas BRA can be made small.

Figure 10:
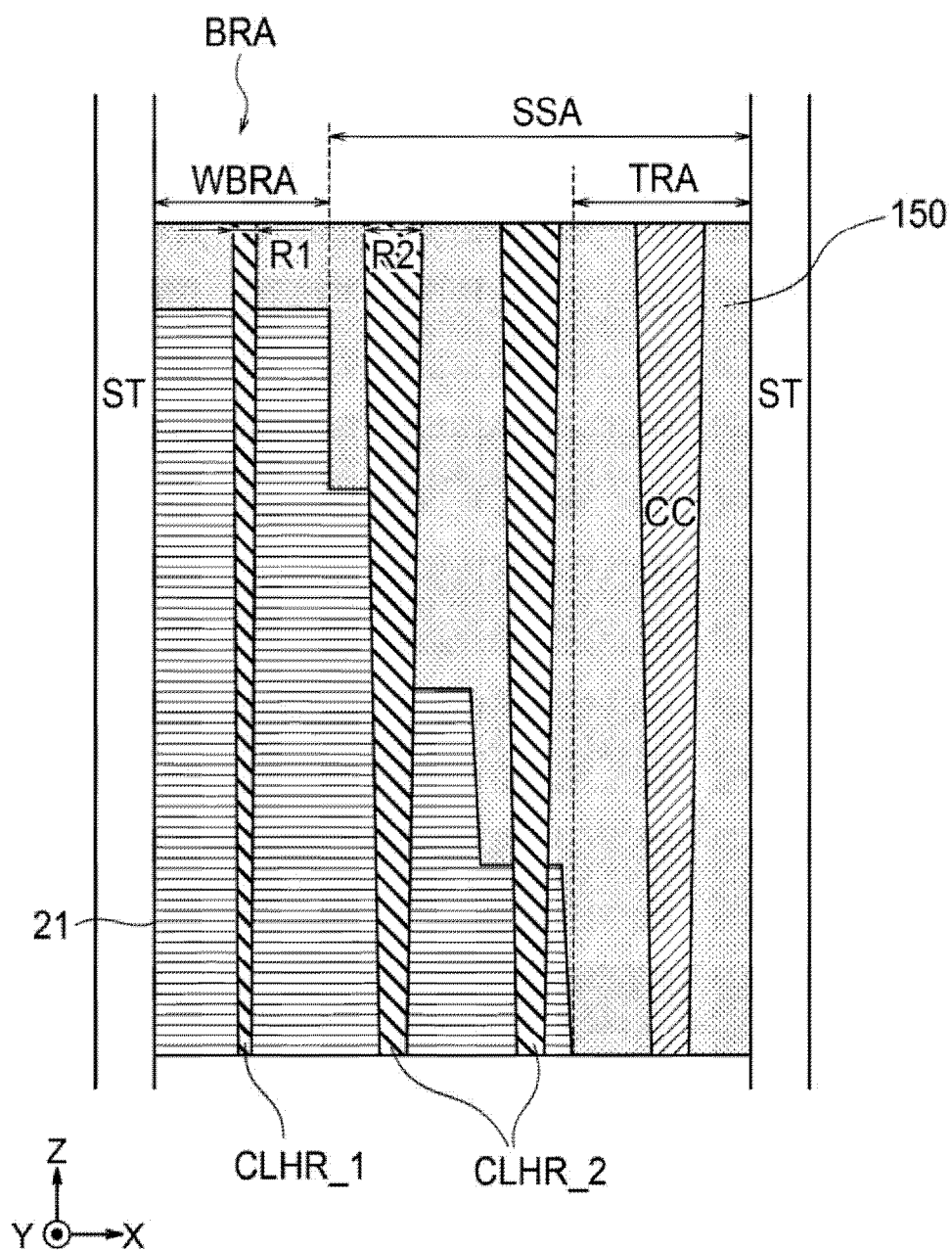
FIG. 10 is a cross-sectional view taken along the line 10-10 of FIG. 9.

FIG. 10 is a cross-sectional view taken along the line 10-10 of FIG. 9A or 9B (Y direction). FIG. 10 illustrates the step area SSA in which the contact plug CC and the insulator columns CLHR_2 are provided, and the bridge area BRA in which the insulator column CLHR_1 is provided. The contact plug CC is provided in a terrace area TRA in the step area SSA. In the terrace area TRA, the contact plug CC is connected to the conductive layer 21 on the lower side. In the step area SSA and the bridge area BRA, the insulator columns CLHR_1 and CLHR_2 penetrate the stacked body 2 of the conductive layer 21 in the Z direction. In the step area SSA, the conductive layer 21 is formed in a step shape, and the insulator columns CLHR_2 with comparatively larger diameters penetrate the conductive layer 21 in a step shape. In the bridge area BRA, the conductive layer 21 is provided to the uppermost layer of the stacked body 2, and the insulator column CLHR_1 with comparatively smaller diameter penetrates the entire conductive layer 21 of the stacked body 2.

In this manner, by making the diameter R1 of the insulator column CLHR_1 of the bridge area BRA smaller, the resistance value of the conductive layer 21 of the bridge area BRA can be decreased without widening the width WBRA of the bridge area BRA. Further, the diameter R1 of the insulator column CLHR_1 preferably has the size to an extent in which the insulator column CLHR_1 can support the conductive layer 21 of the stacked body 2. The appropriate value of the diameter R1 changes by the number of stacking layers or the thickness of the conductive layer 21.

If the width WBRA of the bridge area BRA is widened, the area of the step area SSA becomes narrow, and thus voids are easily generated in a silicon oxide film 150 embedded in the step area SSA. For example, if the step area SSA provided in the intermediate portion of the memory cell array MCA is widened, the resistance of the bridge area BRA that connects the memory cell arrays MCA on the both sides thereof increases, and the word line resistance rises. There is a concern that the rise of the word line resistance deteriorates the voltage controllability of the word line WL. However, if the step area SSA is narrowed in order to widen the bridge area BRA, there is a concern that voids are generated in the silicon oxide film embedded in the step area SSA. This becomes the cause of decreasing the reliability of the semiconductor storage device.

In contrast, according to the present embodiment, the resistance value of the conductive layer 21 of the bridge area BRA can be substantially decreased without widening the width WBRA of the bridge area BRA. Accordingly, the voltage control of the conductive layer 21 (the word line WL) can be facilitated while preventing voids from being generated in the silicon oxide film 150.

Second Embodiment

Figure 11:
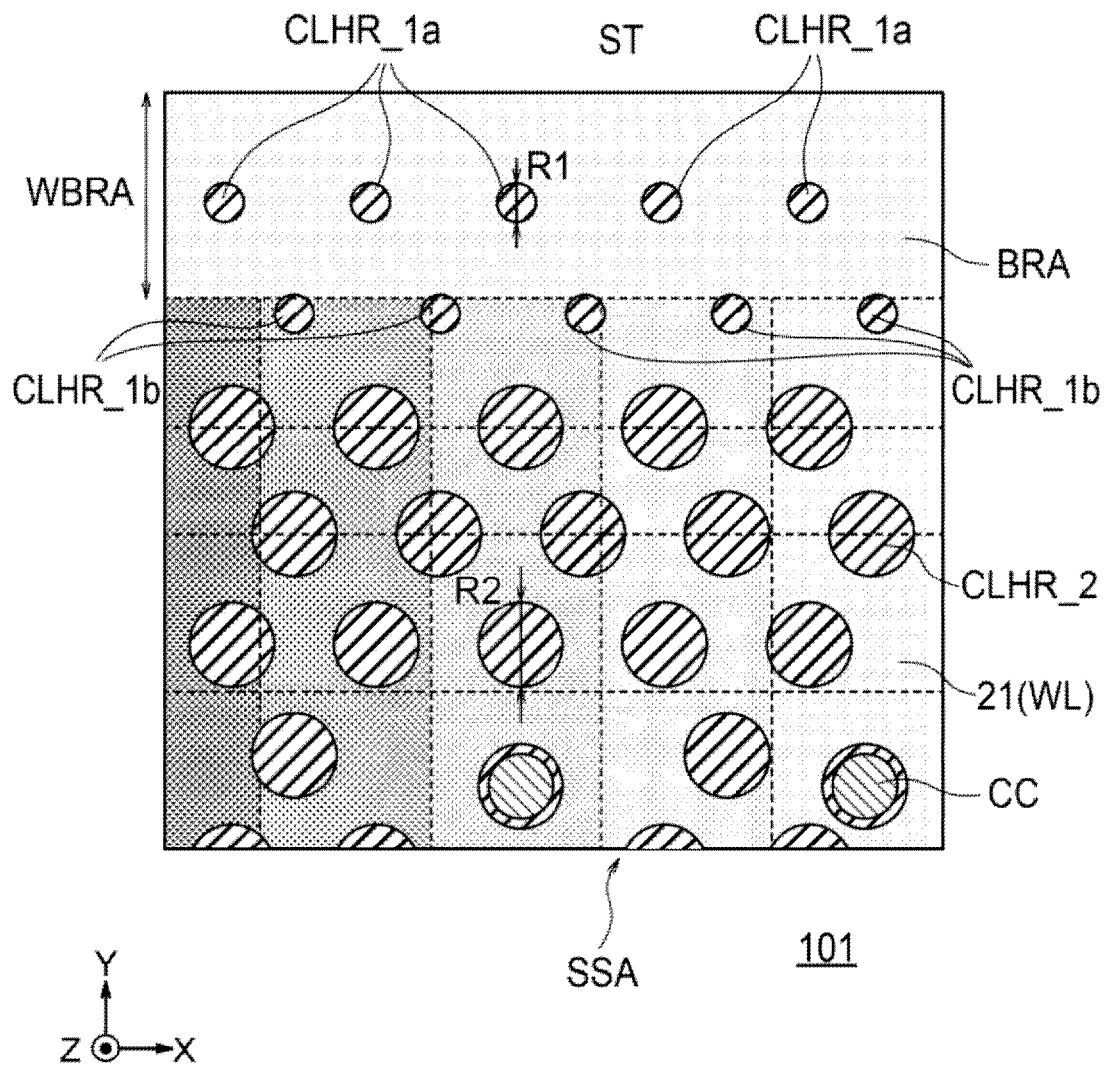
FIG. 11 is a plan view illustrating a connection region according to a second embodiment.

FIG. 11 is a plan view illustrating the connection region 101 according to a second embodiment. According to the second embodiment, the diameters R1 of the insulator columns CLHR_1, among the insulator columns CLHR, of which at least a portion overlaps with the bridge area BRA are smaller than the diameters R2 of the insulator columns CLHR_2 provided in the step area SSA. In FIG. 11, all insulator columns CLHR_1a on the first row arranged in the X direction overlap with the bridge area BRA, and a portion of insulator columns CLHR_1b on the second row adjacent thereto overlaps with the bridge area BRA. That is, when being seen in the Z direction, the insulator columns CLHR_1b on the second row are provided in a boundary portion between the bridge area BRA and the step area SSA. Accordingly, the diameters R1 of the insulator columns CLHR_1a in the bridge area BRA and the diameters R1 of the insulator columns CLHR_1b provided in the boundary portion between the bridge area BRA and the step area SSA are smaller than the diameters R2 of the insulator columns CLHR_2. Accordingly, the electrical resistance value of the conductive layer 21 of the bridge area BRA can be further decreased without widening the width WBRA of the conductive layer 21 in the bridge area BRA. Further, the diameters of the insulator columns CLHR_1a and CLHR_1b is only required to be smaller than the diameters R2, and may be different from each other. The other configurations of the second embodiment may be the same as the configurations corresponding to the first embodiment. Accordingly, the second embodiment can obtain the effect of the first embodiment.

In the second embodiment, a portion of the insulator columns CLHR_1b on the second row overlaps with the boundary portion between the bridge area BRA and the step area SSA. However, as long as the insulator columns CLHR_1b on the second row are near the boundary portion of the bridge area BRA and the step area SSA, the insulator columns CLHR_1b may not overlap with the boundary portion. For example, on the contrary, if the insulator columns CLHR_1b have the same diameter R2 as the insulator columns CLHR_2, the insulator columns CLHR_1b may overlap with the boundary portion between the bridge area BRA and the step area SSA. However, in such a case, as a result of causing the diameters of the insulator columns CLHR_1b to be small, the insulator columns CLHR_1b do not overlap with the boundary portion between the bridge area BRA and the step area SSA. In this case, the insulator columns CLHR_1b on the second row are near the boundary portion between the bridge area BRA and the step area SSA but are not overlapped with the boundary portion.

Third Embodiment

Figure 12:
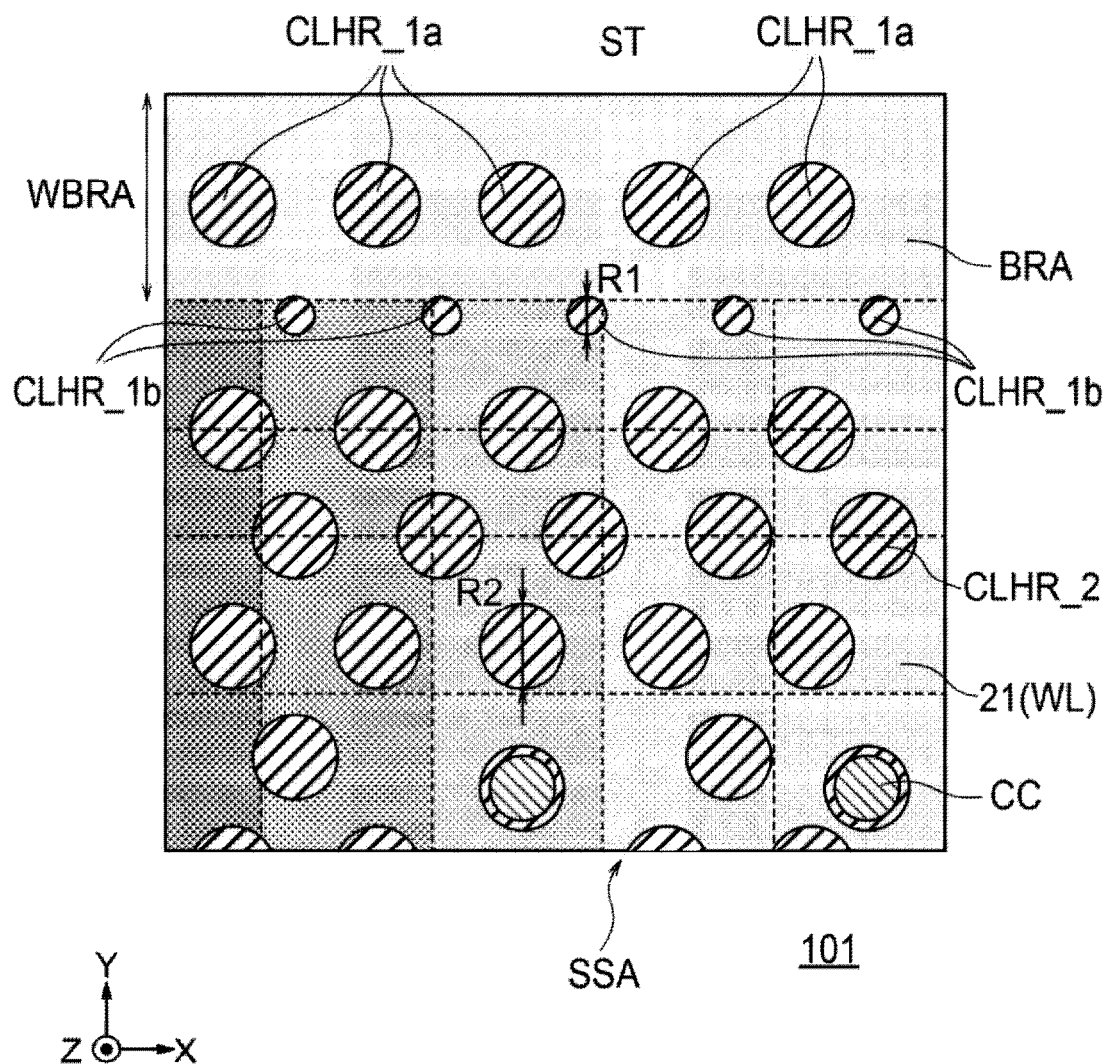
FIG. 12 is a plan view illustrating a connection region according to a third embodiment.

FIG. 12 is a plan view illustrating the connection region 101 according to a third embodiment. According to the third embodiment, the diameters R1 of the insulator columns CLHR_1b, among the insulator columns CLHR, of which a portion overlaps with the bridge area BRA are smaller than the diameters R2 of the insulator columns CLHR_2 provided in the step area SSA. However, in FIG. 12, the diameters of the insulator columns CLHR_1a all of which overlap with the bridge area BRA are the diameters R2 substantially identical with those of the insulator columns CLHR_2 of the step area SSA. In this manner, only the diameters R1 of the insulator columns CLHR_1b that overlap with the boundary portion between the bridge area BRA and the step area SSA may be made small. Even in this case, the electrical resistance value of the conductive layer 21 of the bridge area BRA can be decreased to an extent without widening the width WBRA of the conductive layer 21. The rest of the configurations of the second embodiment may be the same as the configurations corresponding to the first embodiment. Accordingly, the second embodiment can also obtain the effect of the first embodiment.

Also in the third embodiment, in the same manner as in the second embodiment, the insulator columns CLHR_1b on the second row are near the boundary portion between the bridge area BRA and the step area SSA and may not overlap with the boundary portion.

Fourth Embodiment

Figure 13:
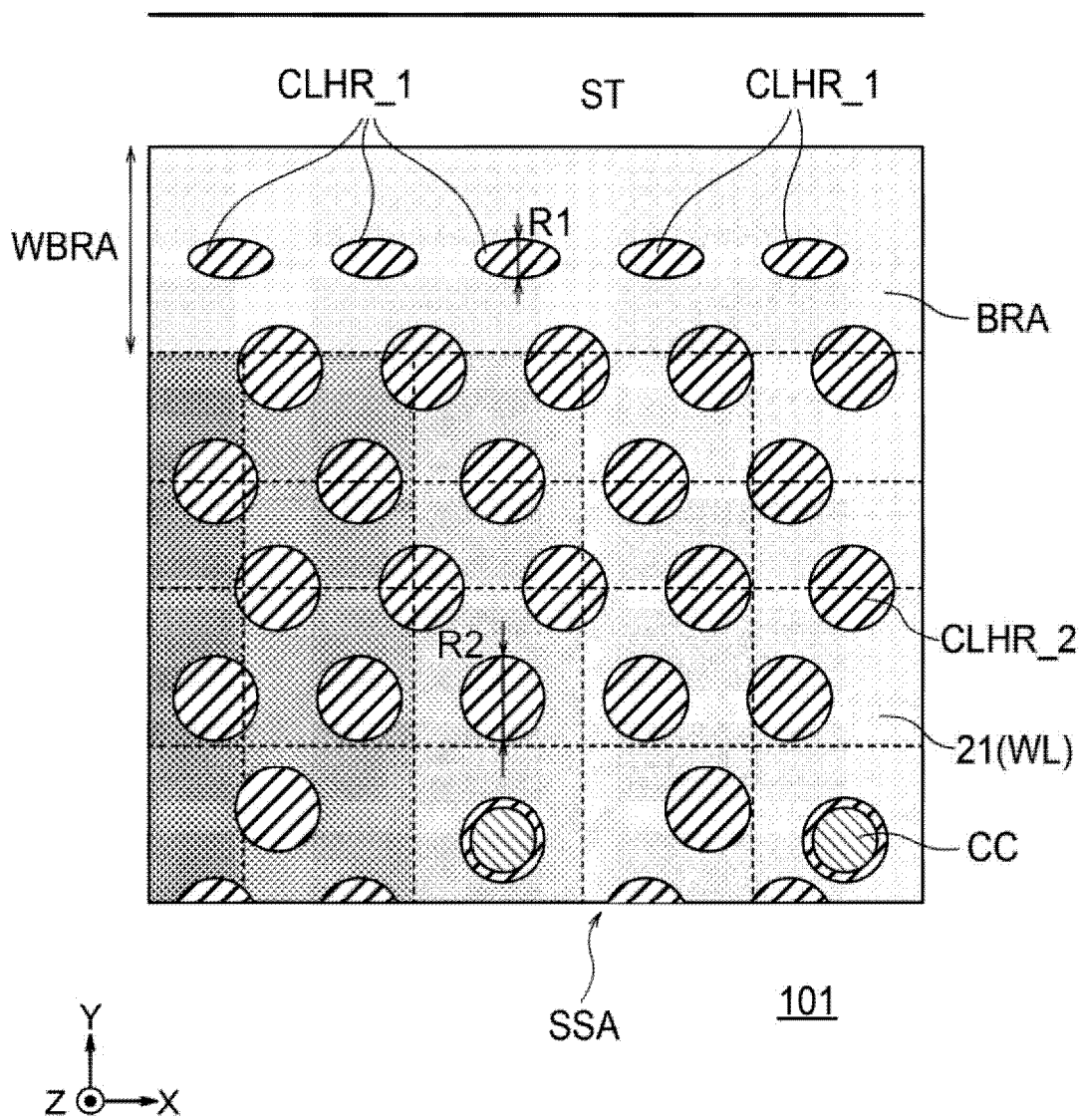
FIG. 13 is a plan view illustrating a connection region according to a fourth embodiment.

FIG. 13 is a plan view illustrating the connection region 101 according to a fourth embodiment. According to the fourth embodiment, when being seen in the Z direction, among the insulator columns CLHR, the insulator columns CLHR_1 that overlap with the bridge area BRA have substantially oval shapes with long diameters in the extension direction of the bridge area BRA (that is, the extension direction of the boundary portion between the bridge area BRA and the step area SSA: the X direction). This long diameter may be the same as or longer than the diameter R2 of the insulator column CLHR_2 of the step area SSA. However, the short diameters R1 of the insulator columns CLHR_1 are smaller than the diameters R2 of the insulator columns CLHR_2 provided in the step area SSA. Accordingly, the substantial width of the conductive layer 21 of the bridge area BRA can be widened without widening the width WBRA of the conductive layer 21 in the bridge area BRA, and thus the electrical resistance value can be further decreased. The rest of the configurations of the fourth embodiment may be the same as the configurations corresponding to the first embodiment. Accordingly, the fourth embodiment can obtain the effect of the first embodiment.

Further, in FIG. 13, only one row of the insulator columns CLHR_1 arranged in the X direction in which the bridge area BRA extends overlaps with the bridge area BRA. However, as described with reference to FIG. 9B, the insulator columns CLHR_1 that overlap with the bridge area BRA may be a plurality of rows. In this case, the stacked body 2 of the bridge area BRA is supported by a plurality of rows of the insulator columns CLHR_1, and thus the conductive layer 21 of the stacked body 2 are more securely supported. In addition, the resistance value of the bridge area BRA can be made smaller by making the short diameters R1 of the plurality of rows of the insulator columns CLHR_1 smaller than the diameters R2 of the insulator columns CLHR_2 of the step area SSA.

Fifth Embodiment

Figure 14:
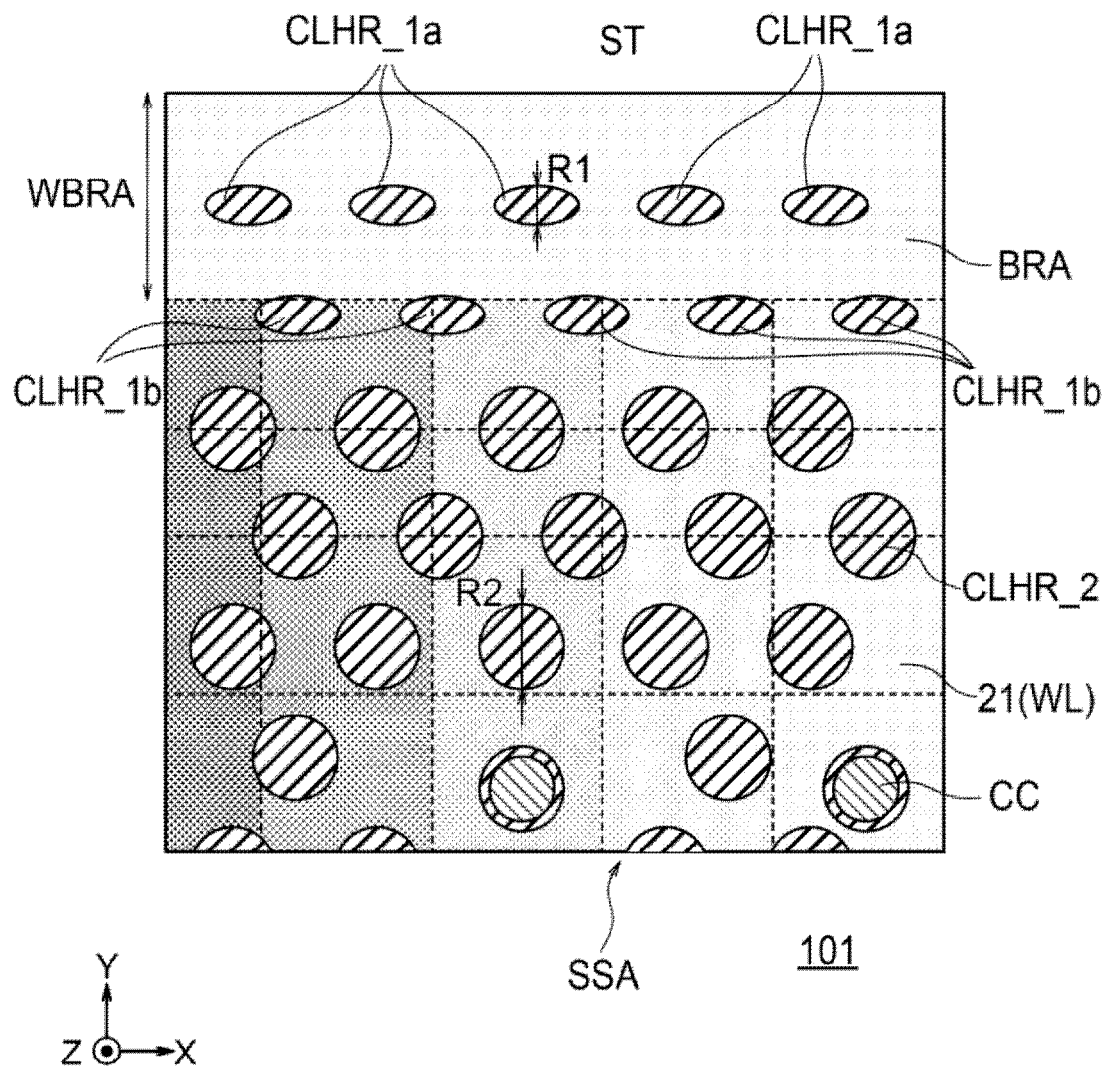
FIG. 14 is a plan view illustrating a connection region according to a fifth embodiment.

FIG. 14 is a plan view illustrating the connection region 101 according to a fifth embodiment. According to the fifth embodiment, among the insulator columns CLHR, the insulator columns CLHR_1a and CLHR_1b of which at least a portion overlaps with the bridge area BRA have substantially oval shapes with long diameters in the extension direction of the bridge area BRA (that is, the extension direction of the boundary portion between the bridge area BRA and the step area SSA: X direction). That is, the fifth embodiment is a combination of the second and fourth embodiments.

In FIG. 14, all of one row of insulator columns CLHR_1a arranged in the X direction overlap with the bridge area BRA, and a portion of the insulator columns CLHR_1b on the second row which are adjacent thereto overlaps with the bridge area BRA. That is, when being seen in the Z direction, the insulator columns CLHR_1b on the second row are provided in the boundary portion between the bridge area BRA and the step area SSA. Accordingly, the short diameters R1 of the insulator columns CLHR_1a in the bridge area BRA and the short diameters R1 of the insulator columns CLHR_1b provided in the boundary portion between the bridge area BRA and the step area SSA are smaller than the diameters R2 of the insulator columns CLHR_2.

The long diameters of the insulator columns CLHR_1a and CLHR_1b in the X direction may be the same as or longer than the diameters R2 of the insulator columns CLHR_2 of the step area SSA. However, the short diameters R1 of the insulator columns CLHR_1a and CLHR_1b in the Y direction are smaller than the diameters R2 of the insulator columns CLHR_2 provided in the step area SSA. Accordingly, the substantial width of the conductive layer 21 of the bridge area BRA can be widened without widening the width WBRA of the conductive layer 21 of the bridge area BRA, and the electrical resistance value can be further decreased. The rest of the configurations of the fifth embodiment may be the same as the configurations corresponding to the first embodiment. Accordingly, the fifth embodiment can obtain the effect of the first embodiment.

According to the fifth embodiment, a portion of the insulator columns CLHR_1b on the second row overlaps with the boundary portion between the bridge area BRA and the step area SSA. However, the insulator columns CLHR_1b on the second row are near the boundary portion between the bridge area BRA and the step area SSA and may not overlap with the boundary portion. For example, on the contrary, if the short diameters of the insulator columns CLHR_1b are the same diameters R2 as the insulator columns CLHR_2, the insulator columns CLHR_1b may overlap with the boundary portion between the bridge area BRA and the step area SSA. However, in such a case, as a result of causing the short diameters of the insulator columns CLHR_1b to be smaller, the insulator columns CLHR_1b may not overlap with the boundary portion between the bridge area BRA and the step area SSA. In such as case, the insulator columns CLHR_1b on the second row are near the boundary portion between the bridge area BRA and the step area SSA but do not overlap with the boundary portion.

Sixth Embodiment

Figure 15:
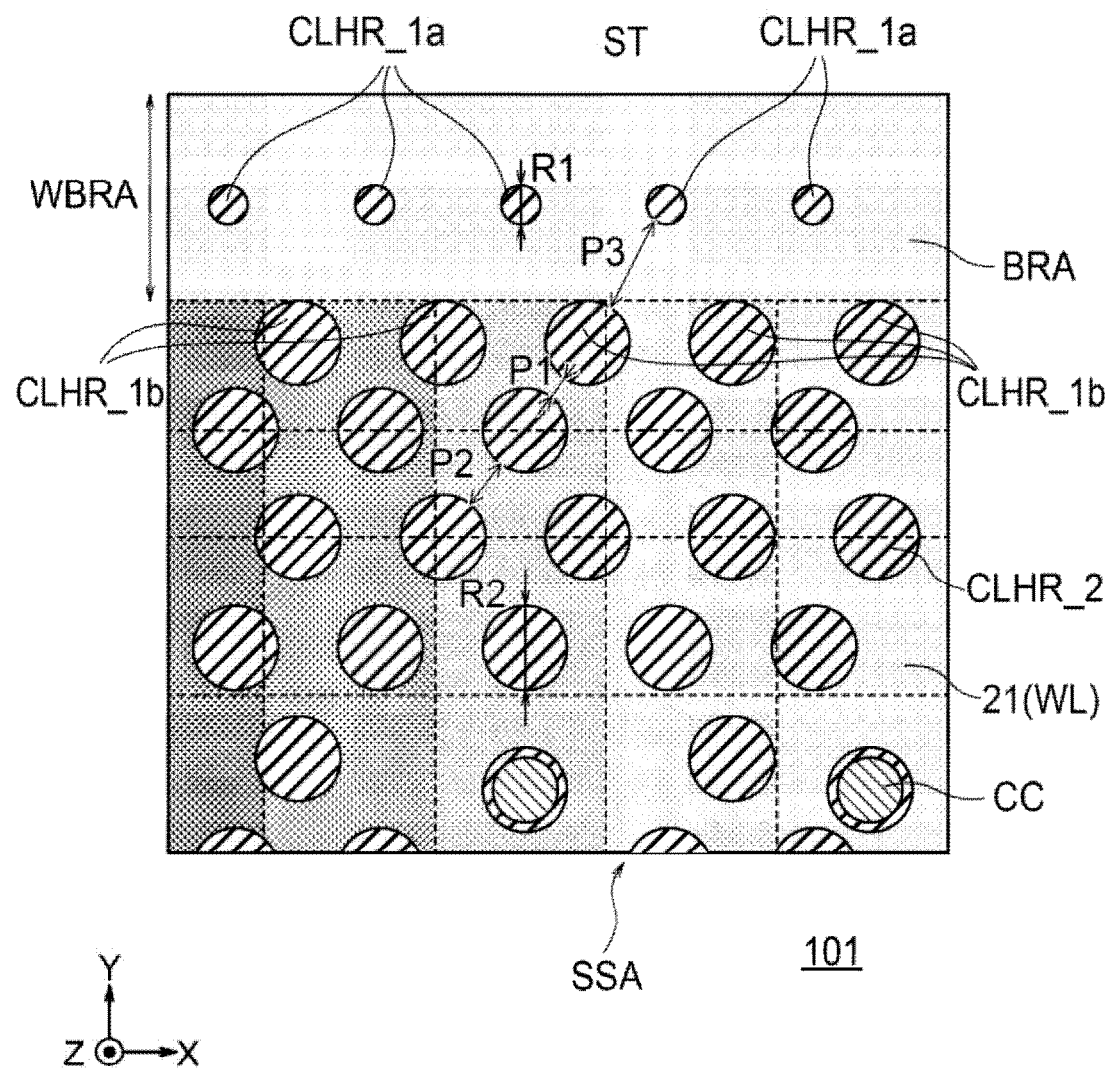
FIG. 15 is a plan view illustrating a connection region according to a sixth embodiment.

FIG. 15 is a plan view illustrating the connection region 101 according to a sixth embodiment. According to the sixth embodiment, when being seen in the Z direction, the insulator columns CLHR_1b on the second row are provided near the boundary portion between the bridge area BRA and the step area SSA but the positions thereof are shifted to the step area SSA side. That is, the insulator columns CLHR_1b provided near the boundary portion between the bridge area BRA and the step area SSA are closer to the insulator columns CLHR_2 in the step area SSA than the insulator columns CLHR_1a in the bridge area BRA. In other words, the pitches of the insulator columns CLHR_1b on the second row are shifted to the −Y direction. Distances (pitches P1) between the insulator columns CLHR_1b and the insulator columns CLHR_2 are narrower than distances (pitches P3) between the insulator columns CLHR_1b and the insulator columns CLHR_1a. Accordingly, the insulator columns CLHR_1b on the second row do not overlap with the bridge area BRA. Or, the overlap between the insulator columns CLHR_1b on the second row and the bridge area BRA becomes small. In addition, the distances (the pitches P1) between the insulator columns CLHR_1b and the insulator columns CLHR_2 adjacent thereto are narrower than the distances (pitches P2) between the insulator columns CLHR_2. In this manner, by shifting pitches of the insulator columns CLHR_1b provided near the boundary portion between the bridge area BRA and the step area SSA, the electrical resistance value of the conductive layer 21 of the bridge area BRA can be further decreased without widening the width WBRA of the conductive layer 21 in the bridge area BRA. The rest of the configurations of the sixth embodiment may be the same as the configurations corresponding to the first embodiment. Accordingly, the sixth embodiment can obtain the effect of the first embodiment.

Seventh Embodiment

Figure 16:
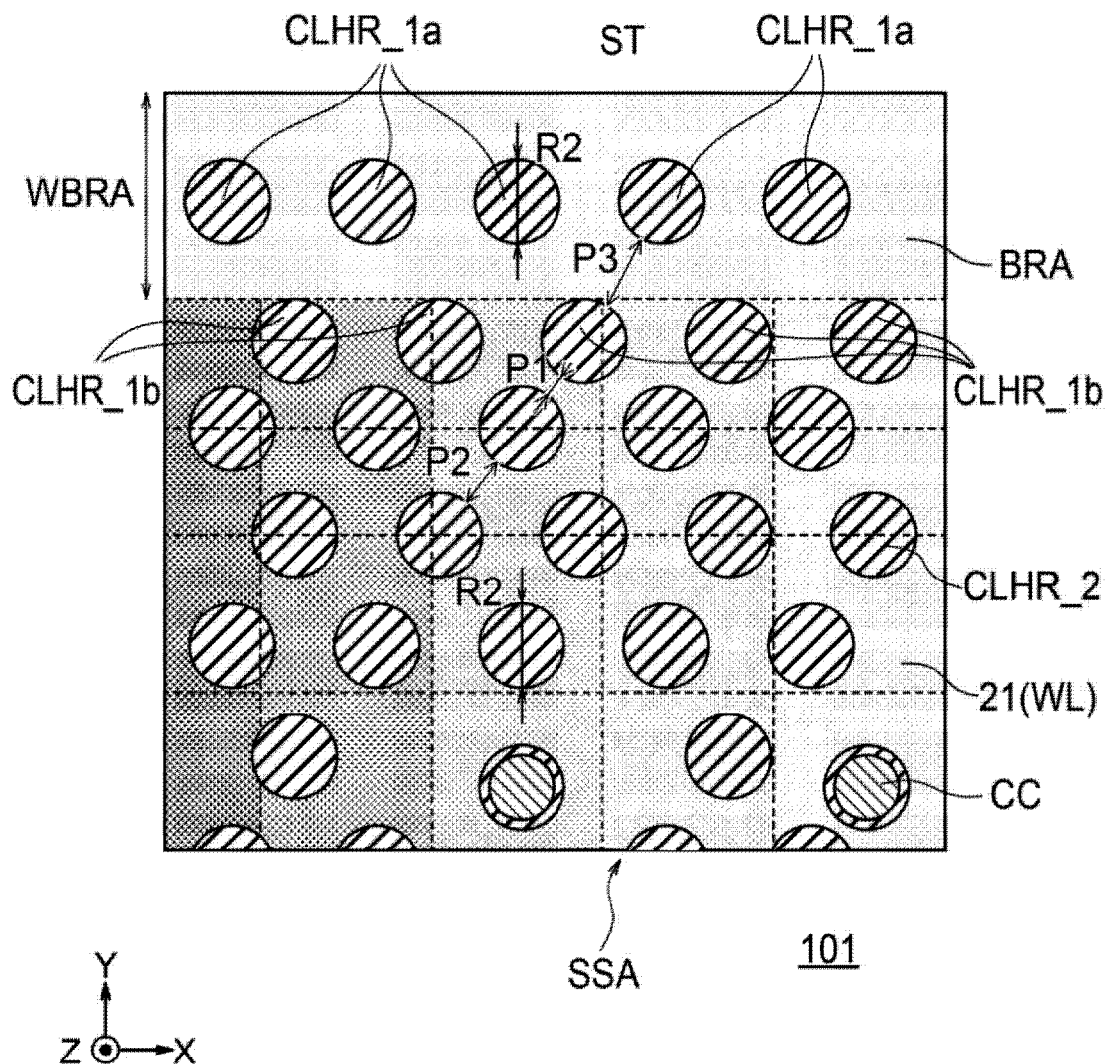
FIG. 16 is a plan view illustrating a connection region according to a seventh embodiment.

FIG. 16 is a plan view illustrating the connection region 101 according to a seventh embodiment. According to the seventh embodiment, when being seen in the Z direction, the insulator columns CLHR_1b on the second row are closest to the boundary portion between the bridge area BRA and the step area SSA, but positions are shifted to the step area SSA side and provided in the step area SSA. The insulator columns CLHR_1a on the first row that overlap with the bridge area BRA have substantially the same diameters R2 as the insulator columns CLHR_2 of the step area SSA. The rest of the configurations of the seventh embodiment may be the same as the configurations corresponding to the sixth embodiment. Accordingly, when being seen in the Z direction, the pitches P1 between the insulator columns CLHR_1b which are provided in the step area SSA and are the closest to the boundary portion between the bridge area BRA and the step area SSA and the insulator columns CLHR_2 adjacent thereto are narrower than the pitches P2 between the insulator columns CLHR_2 provided in the step area SSA and adjacent to the insulator columns CLHR_1b. In addition, the pitches P1 are narrower than the pitches P3 between the insulator columns CLHR_1a provided in the bridge area BRA and the insulator columns CLHR_1b.

Also in this case, by shifting the pitches of the insulator columns CLHR_1b provided near the boundary portion between the bridge area BRA and the step area SSA, the insulator columns CLHR_1b on the second row do not overlap with the bridge area BRA. Or, the overlap of the insulator columns CLHR_1b on the second row with the bridge area BRA becomes small. Accordingly, the electrical resistance value of the conductive layer 21 of the bridge areas BRA can be decreased to an extent without widening the width WBRA of the conductive layer 21 in the bridge area BRA.

(Modification)

Figure 17:
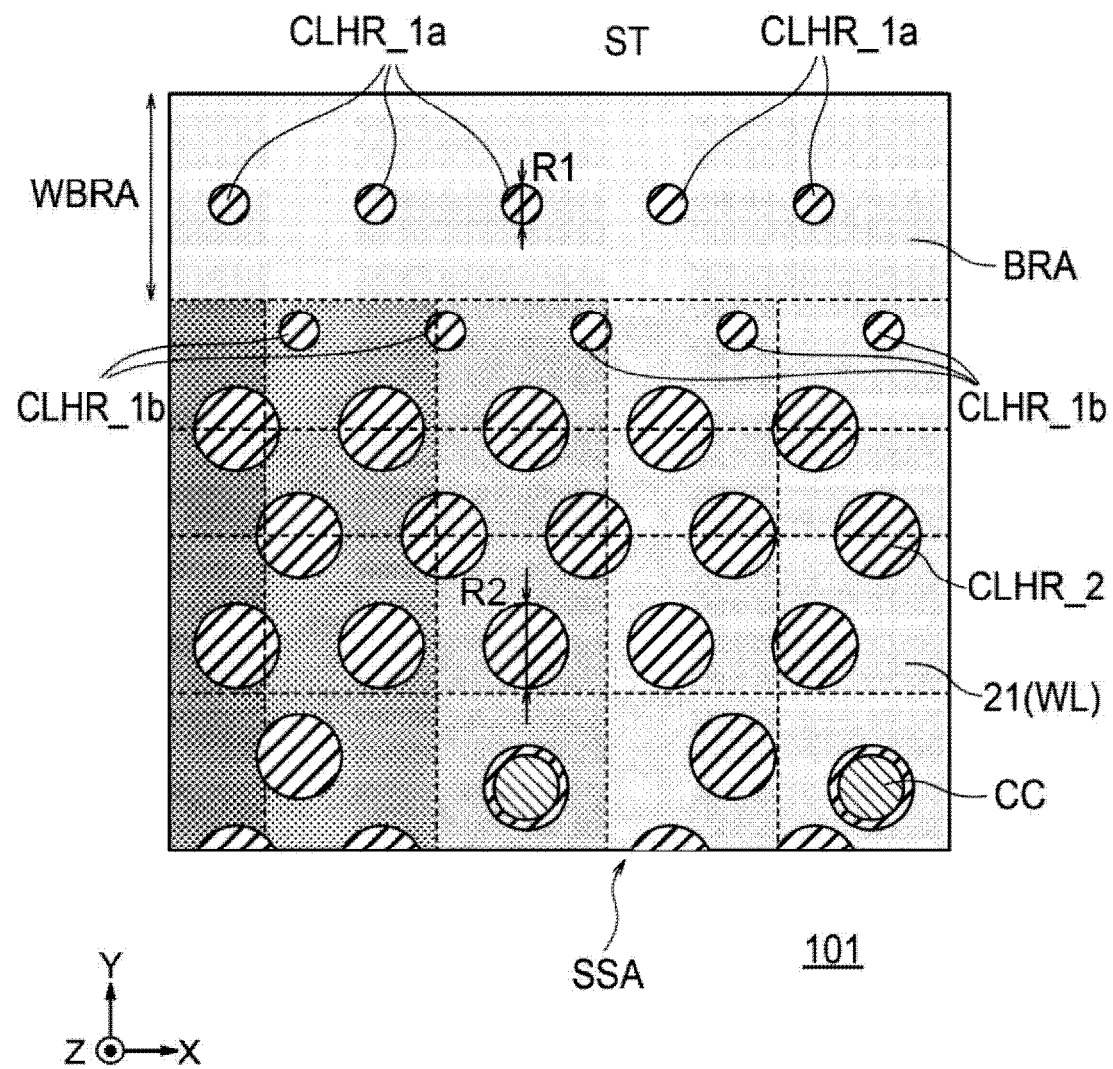
FIG. 17 is a diagram illustrating an example obtained by combining the second embodiment and the seventh embodiment.

The seventh embodiment may be combined not only with the first embodiment but also with the second to fifth embodiments. For example, FIG. 17 is a diagram illustrating an example obtained by combining the second and seventh embodiments. When being seen in the Z direction, in FIG. 17, the diameters R1 of the insulator columns CLHR_1a and CLHR_1b on the first and second rows are smaller than the diameters R2 of the insulator columns CLHR_2. Further, the insulator columns CLHR_1b on the second row are provided near the boundary portion between the bridge area BRA and the step area SSA, but positions are shifted to the step areas SSA side. Accordingly, the electrical resistance value can be further decreased without widening the width WBRA of the conductive layer 21 in the bridge area BRA.

Figure 18:
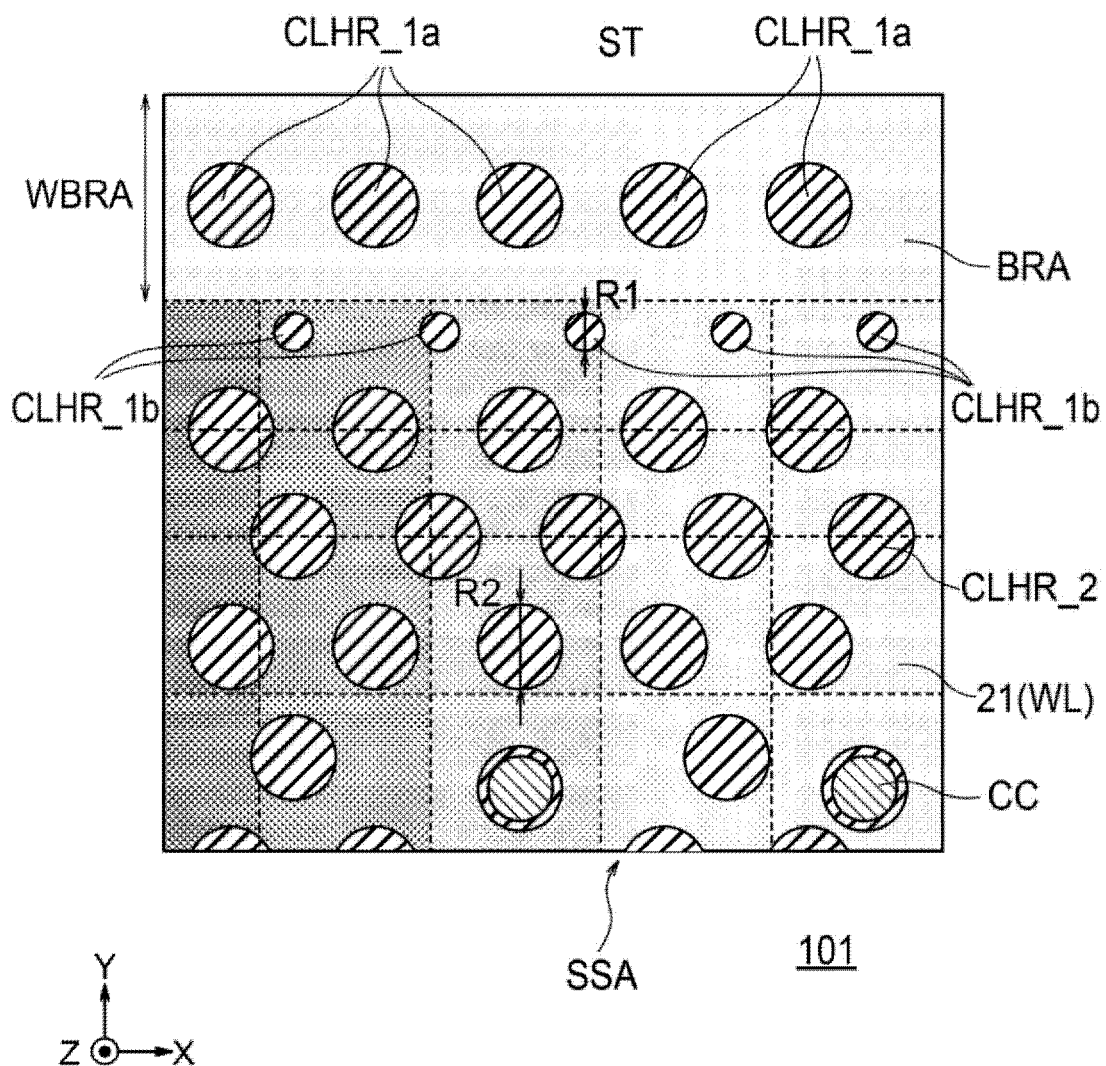
FIG. 18 is a diagram illustrating an example obtained by combining the third embodiment and the seventh embodiment.

For example, FIG. 18 is a diagram illustrating an example obtained by combining the third and seventh embodiments. When being seen in the Z direction, in FIG. 18, the diameters of the insulator columns CLHR_1a on the first row are substantially identical to the diameters R2 of the insulator columns CLHR_2. However, the diameters R1 of the insulator columns CLHR_1b on the second row are smaller than the diameters R2 of the insulator columns CLHR_2, and the positions of the insulator columns CLHR_1b on the second row are shifted to the step areas SSA side. Accordingly, the insulator columns CLHR_1b on the second row do not overlap with the bridge area BRA. Or, the overlap between the insulator columns CLHR_1 on the second row and the bridge areas BRA becomes small. Accordingly, the electrical resistance value of the conductive layer 21 of the bridge area BRA can be decreased to an extent without widening the width WBRA of the conductive layer 21 in the bridge area BRA.

Figure 19:
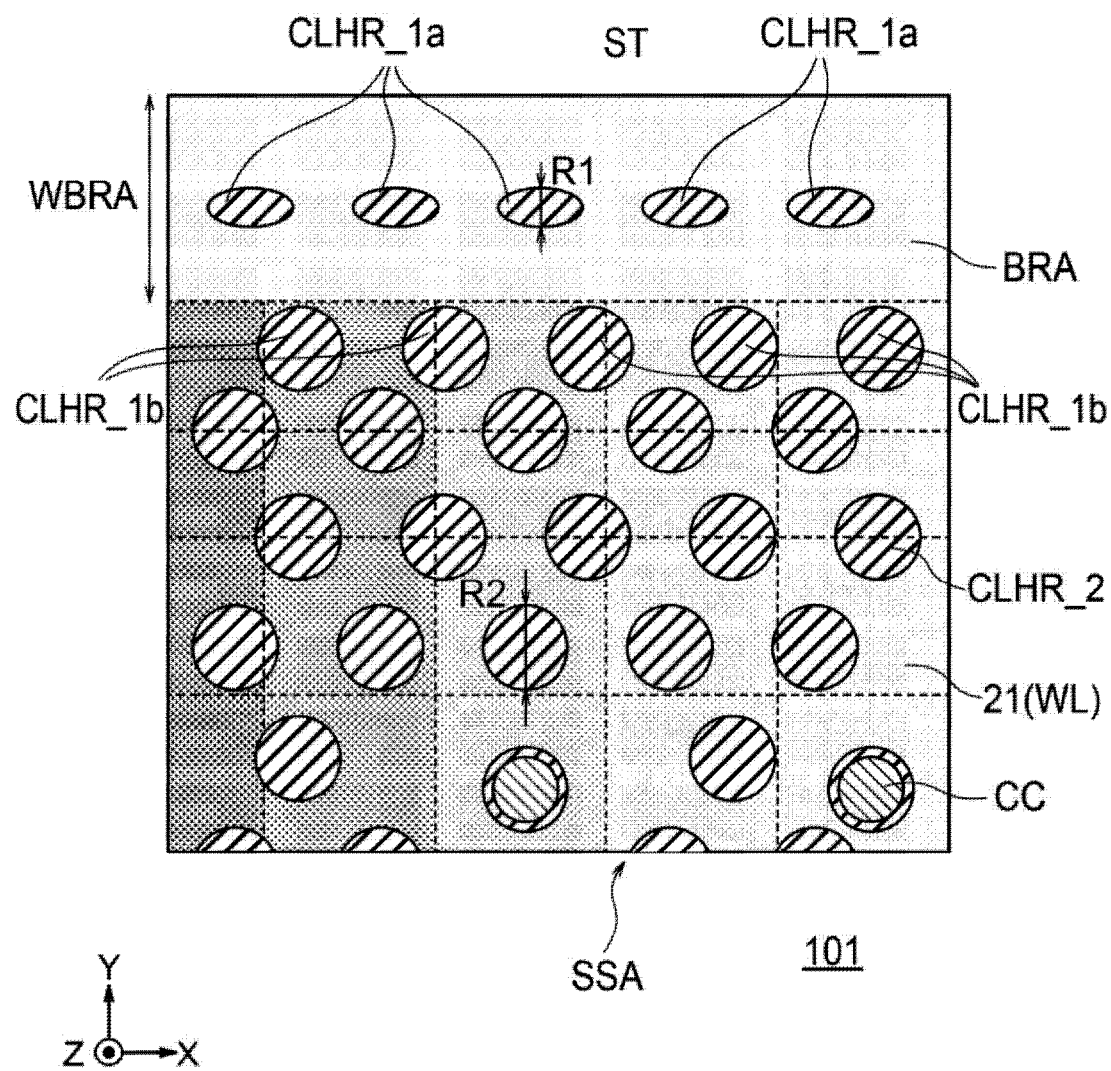
FIG. 19 is a diagram illustrating an example obtained by combining the fourth embodiment and the seventh embodiment.

For example, FIG. 19 is a diagram illustrating an example obtained by combining the fourth and seventh embodiments. When being seen in the Z direction, in FIG. 19, among the insulator columns CLHR, the insulator columns CLHR_1a that overlap with the bridge area BRA have substantially oval shapes with long diameters in the extension direction of the bridge area BRA (X direction). However, the short diameters R1 of the insulator columns CLHR_1a are smaller than the diameters R2 of the insulator columns CLHR_2 provided in the step area SSA. The diameters of the insulator columns CLHR_1b on the second row are substantially identical to the diameters R2 of the insulator columns CLHR_2, and the positions of the insulator columns CLHR_1*b* on the second row are shifted to the step areas SSA side. Accordingly, the insulator columns CLHR_1*b* on the second row do not overlap with the bridge area BRA. Or, the overlap between the insulator columns CLHR_1*b* on the second row and the bridge area BRA becomes small.

According to this configuration, the electrical resistance value of the conductive layer 21 of the bridge area BRA can be further decreased without widening the width WBRA of the conductive layer 21 in the bridge area BRA.

Figure 20:
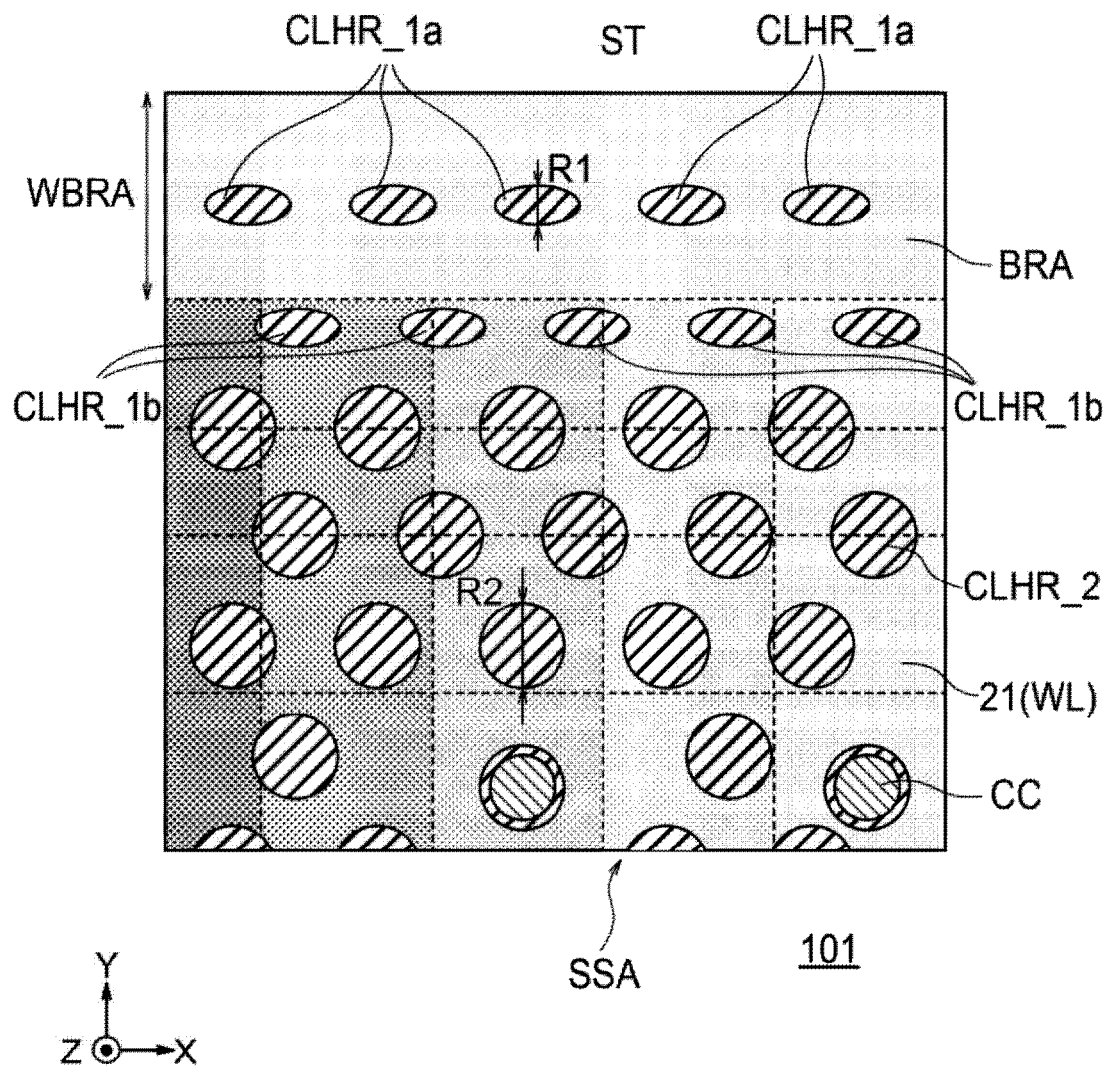
FIG. 20 is a diagram illustrating an example obtained by combining the fifth embodiment and the seventh embodiment.

For example, FIG. 20 is a diagram illustrating an example obtained by combining the fifth and seventh embodiments. When being seen in the Z direction, in FIG. 20, both of the insulator columns CLHR_1*a* and CLHR_1*b* have substantially oval shapes with long diameters in the extension direction of the bridge area BRA (the X direction). In addition, the positions of the insulator columns CLHR_1*b* on the second row are shifted to the step areas SSA side. Accordingly, the insulator columns CLHR_1*b* on the second row do not overlap with the bridge area BRA. Or, the overlap between the insulator columns CLHR_1*b* on the second row and the bridge areas BRA becomes small.

According to this configuration, the electrical resistance value of the conductive layer 21 of the bridge area BRA can be further decreased without widening the width WBRA of the conductive layer 21 in the bridge area BRA.

Figure 21:
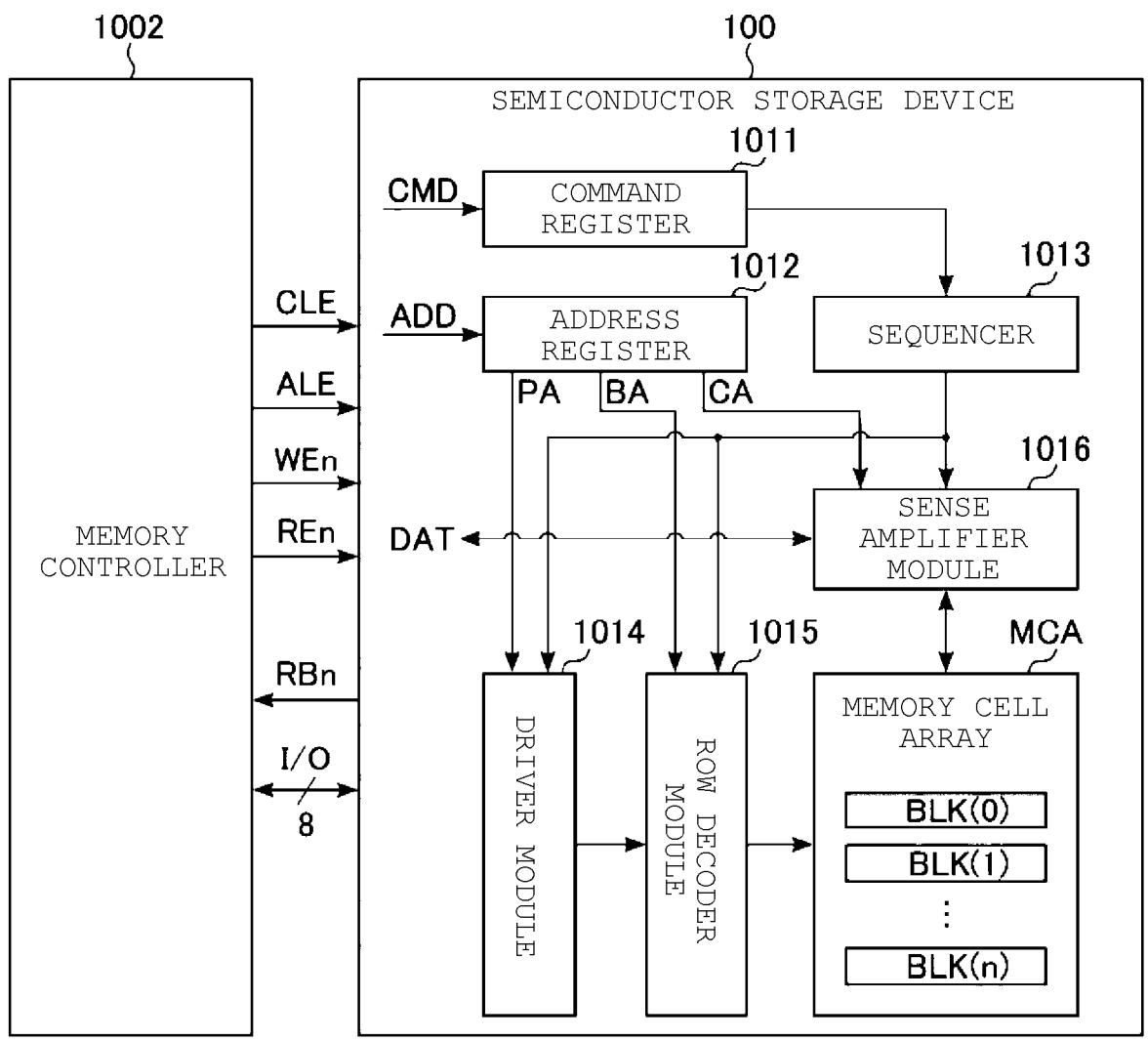
FIG. 21 is a block diagram illustrating a configuration example of a semiconductor storage device to which any one of the above embodiments is applied.

FIG. 21 is a block diagram illustrating a configuration example of the semiconductor storage device to which any one of the above embodiments is applied. The semiconductor storage device 100 is a NAND-type flash memory that can store data in a non-volatile manner and is controlled by an external memory controller 1002. The communication between the semiconductor storage device 100 and the memory controller 1002 support, for example, the NAND interface standard.

As illustrated in FIG. 21, the semiconductor storage device 100 includes, for example, the memory cell array MCA, a command register 1011, an address register 1012, a sequencer 1013, a driver module 1014, a row decoder module 1015, and a sense amplifier module 1016.

The memory cell array MCA includes the plurality of blocks BLK(0) to BLK(n) (n is an integer of 1 or more). The blocks BLK are a set including a plurality of memory cells that can store data in a non-volatile manner, and are used, for example, as an erasure unit of the data. In addition, a plurality of bit lines and a plurality of word lines are provided in the memory cell array MCA. Each memory cell can be obtained, for example, by associating one bit line and one word line. Specific configurations of the memory cell array MCA are described below.

The command register 1011 stores a command CMD received by the semiconductor storage device 100 from the memory controller 1002. The command CMD includes a command, for example, for causing the sequencer 1013 to execute the read operation, the write operation, the erase operation, and the like.

The address register 1012 stores address information ADD received by the semiconductor storage device 100 from the memory controller 1002. The address information ADD includes, for example, a block address BAdd, a page address PAdd, and a column address CAdd. For example, the block address BAdd, the page address PAdd, and the column address CAdd are used to select the block BLK, the word line, and the bit line, respectively.

The sequencer 1013 controls the operation of the entire semiconductor storage device 100. For example, the sequencer 1013 controls the driver module 1014, the row decoder module 1015, the sense amplifier module 1016, and the like based on the command CMD stored in the command register 1011 and executes the read operation, the write operation, the erase operation, and the like.

The driver module 1014 generates the voltage to be used for the read operation, the write operation, the erase operation, and the like. Also, the driver module 1014 applies the generated voltage to the signal line corresponding to the selected word line, for example, based on the page address PAdd stored in the address register 1012.

The row decoder module 1015 includes a plurality of row decoders RD. The row decoder RD selects one block BLK in the corresponding memory cell array MCA based on the block address BAdd stored in the address register 1012. Also, the row decoder RD transmits, for example, the voltage applied to the signal line corresponding to the selected word line to the selected word line in the selected block BLK.

In the write operation, the sense amplifier module 1016 applies the desired voltage to each bit line according to write data DAT received from the memory controller 1002. In addition, in the read operation, the sense amplifier module 1016 determines data stored in the memory cell based on the voltage of the bit line and transmits the determination result to the memory controller 1002 as read data DAT.

The semiconductor storage device 100 and the memory controller 1002 described above may configure one semiconductor device by the combination of these. Examples of the semiconductor device like this include a memory card such as an SDTM card or a solid state drive (SSD).

Figure 22:
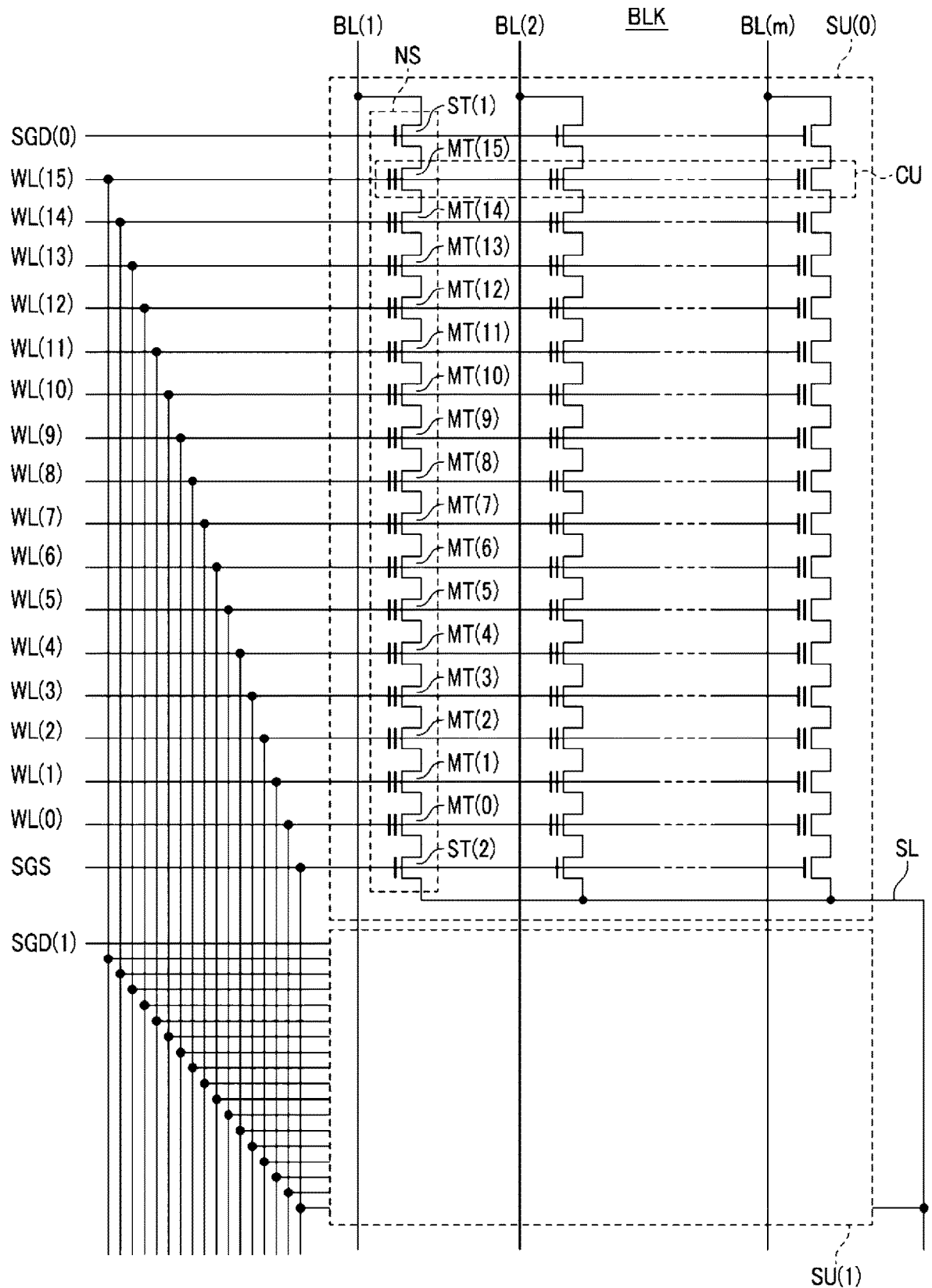
FIG. 22 is a circuit diagram illustrating an example of a circuit configuration of a memory cell array.

FIG. 22 is a circuit diagram illustrating an example of a circuit configuration of the memory cell array MCA. Among the plurality of blocks BLK in the memory cell array MCA, one block BLK is extracted. As illustrated in FIG. 22, the block BLK includes a plurality of string units SU(0) to SU(k) (k is an integer of 1 or more).

Each of the string units SU includes a plurality of NAND strings NS respectively associated with bit lines BL (0) to BL (m) (m is an integer of 1 or more). Each of the NAND strings NS includes, for example, memory cell transistors MT(0) to MT(15) and select transistors ST(1) and ST(2). The memory cell transistors MT include the control gates and charge storage layers and store data in a non-volatile manner. Each of the select transistors ST(1) and ST(2) is used for selecting the string units SU in various operations.

In each of the NAND strings NS, the memory cell transistors MT(0) to MT (15) are connected in series. The drain of the select transistor ST (1) is connected to the associated bit line BL, and the source of the select transistor ST(1) is connected to one end of the memory cell transistors MT(0) to MT(15) connected in series. The drain of the select transistor ST(2) is connected to the other end of the memory cell transistors MT(0) to MT(15) connected in series. The source of the select transistor ST(2) is connected to a source line SL.

In the same block BLK, the control gates of the memory cell transistors MT(0) to MT(15) are each commonly connected to the word lines WL(0) to WL(7). The gates of the respective select transistors ST(1) in the string units SU(0) to SU(k) are each commonly connected to select gate lines SGD(0) to SGD(k). The gates of the select transistors ST(2) are commonly connected to the select gate line SGS.

In the circuit configuration of the memory cell array MCA described above, the bit lines BL are shared by the NAND strings NS to which the same column address is allocated in each of the string units SU. The source line SL is shared, for example, by the plurality of blocks BLK.

The set including the plurality of memory cell transistors MT connected to the common word lines WL in one string unit SU is referred to, for example, as a cell unit CU. For example, the storage capacitance of the cell unit CU including the memory cell transistors MT each that store 1-bit data is defined as "1-page data". According to the number of bits of data stored by the memory cell transistors MT, the cell unit CU may have storage capacitance of 2-page data or more.

Further, the memory cell array MCA in the semiconductor storage device 100 according to the present embodiment is not limited to the circuit configuration described above. For example, the numbers of the memory cell transistors MT and the select transistors ST(1) and ST(2) in each NAND string NS may be any numbers. The number of the string units SU in each block BLK may be designed to be any number.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
   a first region that includes a plurality of first conductive layers separated from each other in a first direction, first semiconductor pillars extending through the plurality of first conductive layers in the first direction, and memory cells formed at respective intersections between the plurality of first conductive layers and the first semiconductor pillars;
   a second region that includes a plurality of second conductive layers separated from each other in the first direction, second semiconductor pillars extending through the plurality of second conductive layers in the first direction, and memory cells formed at respective intersections between the plurality of second conductive layers and the second semiconductor pillars; and
   a third region that includes a plurality of third conductive layers separated from each other in the first direction and a plurality of insulator columns extending through the plurality of third conductive layers in the first direction, wherein the third region is disposed between the first region and the second region in a second direction intersecting the first direction, and at least one layer of the plurality of third conductive layers extends from one of the plurality of first conductive layers and one of the plurality of second conductive layers,
   wherein the third region includes a fourth region and a fifth region, wherein, in the fourth region, the at least one third conductive layer electrically connects the one of the plurality of first conductive layers and the one of the plurality of second conductive layers to each other, and wherein in the fifth region, the at least one third conductive layer is connected to a contact plug, and
   wherein a first diameter of a first subset of the plurality of insulator columns provided in the fourth region is smaller than a second diameter of a second subset of the plurality of insulator columns provided in the fifth region.

2. The semiconductor storage device according to claim 1, wherein the first subset of the plurality of insulator columns are provided in or near a boundary portion between the fourth region and the fifth region.

3. The semiconductor storage device according to claim 1, wherein at least one of the first subset of the plurality of insulator columns has an oval shape with a diameter longer than the first diameter in an extension direction of a boundary portion between the fourth region and the fifth region.

4. The semiconductor storage device according to claim 1, wherein a third subset of the plurality of insulator columns are provided near a boundary portion between the fourth region and the fifth region, and wherein each of the third subset of the plurality of insulator columns is closer to the second subset of the plurality of insulator columns than the first subset of the plurality of insulator columns.

5. A semiconductor storage device comprising:
   a first region that includes a plurality of first conductive layers separated from each other in a first direction, first semiconductor pillars extending through the plurality of first conductive layers in the first direction, and memory cells formed at respective intersections between the plurality of first conductive layers and the first semiconductor pillars;
   a second region that includes a plurality of second conductive layers separated from each other in the first direction, second semiconductor pillars extending through the plurality of second conductive layers in the first direction, and memory cells formed at respective intersections between the plurality of second conductive layers and the second semiconductor pillars; and
   a third region that includes a plurality of third conductive layers separated apart from each other in the first direction and a plurality of insulator columns extending through the plurality of third conductive layers in the first direction, wherein the third region is disposed between the first region and the second region in a second direction intersecting the first direction, and at least one of the plurality of third conductive layers extends from one of the plurality of first conductive layers and one of the plurality of second conductive layers,
   wherein the third region includes a fourth region and a fifth region, wherein, in the fourth region, the at least one of the plurality of third conductive layers electrically connects the one of the plurality of first conductive layers and the one of the plurality of second conductive layers to each other, and wherein in the fifth region, the at least one of the plurality of third conductive layers is connected to a contact plug, and
   wherein a first distance between a first one of the plurality of insulator columns disposed relatively closer to a boundary between the fourth and fifth regions and a second one of the plurality of insulator columns in the fifth region is narrower than a second distance between adjacent second ones of the plurality of insulator columns disposed relatively farther from the boundary.

6. The semiconductor storage device according to claim 5, wherein the first distance is narrower than a third distance between the first one of the plurality of insulator columns and a third one of the plurality of insulator columns disposed in the fourth region.

7. The semiconductor storage device according to claim 4, wherein the third subset of the plurality of insulator columns have a diameter equal to the first diameter.

8. The semiconductor storage device according to claim 4, wherein the third subset of the plurality of insulator columns have a diameter equal to the second diameter.

9. The semiconductor storage device according to claim 4, wherein the third subset of the plurality of insulator columns have an oval shape.

10. The semiconductor storage device according to claim 6, wherein the first one of the plurality of insulator columns has a diameter substantially the same to a diameter of the third one of the plurality of insulator columns.

11. The semiconductor storage device according to claim 6, wherein the first one of the plurality of insulator columns has a diameter smaller than a diameter of the third one of the plurality of insulator columns.

12. The semiconductor storage device according to claim 5, wherein the first one of the plurality of insulator columns has a diameter smaller than a diameter of each of the second ones of the plurality of insulator columns.

13. The semiconductor storage device according to claim 5, wherein the first one of the plurality of insulator columns has a diameter similar to a diameter of each of the second ones of the plurality of insulator columns.

14. The semiconductor storage device according to claim 5, wherein the first one of the plurality of insulator columns has an oval shape.

* * * * *